United States Patent
Shaffer et al.

(10) Patent No.: US 10,961,618 B2
(45) Date of Patent: Mar. 30, 2021

(54) PROCESS FOR PRODUCING CARBON-NANOTUBE GRAFTED SUBSTRATE

(71) Applicant: Imperial College Innovations Limited, London (GB)

(72) Inventors: Milo Sebastian Peter Shaffer, London (GB); David Benbow Anthony, London (GB)

(73) Assignee: Imperial College Innovations Limited, London (GB)

( * ) Notice: Subject to any disclaimer, the term of this patent is extended or adjusted under 35 U.S.C. 154(b) by 13 days.

(21) Appl. No.: 15/326,156

(22) PCT Filed: Jul. 15, 2015

(86) PCT No.: PCT/GB2015/052052
§ 371 (c)(1),
(2) Date: Jan. 13, 2017

(87) PCT Pub. No.: WO2016/009207
PCT Pub. Date: Jan. 21, 2016

(65) Prior Publication Data
US 2017/0198390 A1     Jul. 13, 2017

(30) Foreign Application Priority Data

Jul. 16, 2014 (GB) ...................... 1412656

(51) Int. Cl.
*C23C 16/26* (2006.01)
*C23C 16/02* (2006.01)
(Continued)

(52) U.S. Cl.
CPC .............. *C23C 16/26* (2013.01); *C01B 32/16* (2017.08); *C01B 32/162* (2017.08); *C23C 16/02* (2013.01);
(Continued)

(58) Field of Classification Search
None
See application file for complete search history.

(56) References Cited

U.S. PATENT DOCUMENTS

| 3,580,731 A | 5/1971 | Milweski et al. |
| 4,663,230 A | 5/1987 | Tennent |

(Continued)

FOREIGN PATENT DOCUMENTS

| DE | 4335573 A1 | 4/1995 |
| GB | 2338716 | 4/2003 |

(Continued)

OTHER PUBLICATIONS

Written Opinion of the International Searching Authority for PCT/GB2015/052052 dated Sep. 23, 2015.
(Continued)

*Primary Examiner* — David P Turocy
(74) *Attorney, Agent, or Firm* — McDonnell Boehnen Hulbert & Berghoff LLP

(57) ABSTRACT

The present invention relates to a process for producing a carbon nanotube-grafted substrate, the process comprising: providing a substrate having catalytic material deposited thereon; and synthesising carbon nanotubes on the substrate by a chemical vapour deposition process in a reaction chamber; characterised in that the process comprises providing a counter electrode, applying a potential difference to the substrate in relation to the counter electrode and maintaining the potential difference of the substrate in relation to the counter electrode during the chemical vapour deposition process.

25 Claims, 18 Drawing Sheets

(51) Int. Cl.
*C23C 16/44* (2006.01)
*C01B 32/16* (2017.01)
*C01B 32/162* (2017.01)
*C23C 16/455* (2006.01)
*C23C 16/50* (2006.01)
*D06M 11/74* (2006.01)
*B82Y 30/00* (2011.01)
*B82Y 40/00* (2011.01)
*D06M 101/40* (2006.01)

(52) U.S. Cl.
CPC .......... *C23C 16/44* (2013.01); *C23C 16/455* (2013.01); *C23C 16/50* (2013.01); *D06M 11/74* (2013.01); *B82Y 30/00* (2013.01); *B82Y 40/00* (2013.01); *C01B 2202/06* (2013.01); *D06M 2101/40* (2013.01); *Y10S 977/752* (2013.01); *Y10S 977/843* (2013.01); *Y10S 977/961* (2013.01)

(56) References Cited

U.S. PATENT DOCUMENTS

| | | | |
|---|---|---|---|
| 5,024,818 | A | 6/1991 | Tibbetts et al. |
| 5,165,909 | A | 11/1992 | Tennent et al. |
| 5,187,021 | A | 2/1993 | Vydra et al. |
| 5,374,415 | A | 12/1994 | Alig et al. |
| 5,413,866 | A | 5/1995 | Baker et al. |
| 6,235,674 | B1 | 5/2001 | Tennent et al. |
| 6,837,928 | B1 | 1/2005 | Zhang et al. |
| 7,338,684 | B1 | 3/2008 | Curliss et al. |
| 2001/0024633 | A1 | 9/2001 | Lee et al. |
| 2001/0054633 | A1 | 12/2001 | Martson |
| 2002/0150684 | A1 | 10/2002 | Jayatissa |
| 2004/0009115 | A1 | 1/2004 | Wee et al. |
| 2004/0089237 | A1* | 5/2004 | Pruett ............... C23C 16/26 118/719 |
| 2004/0245088 | A1 | 12/2004 | Gardner et al. |
| 2005/0170089 | A1* | 8/2005 | Lashmore .......... B82Y 10/00 427/248.1 |
| 2007/0025891 | A1 | 2/2007 | Ho et al. |
| 2007/0144887 | A1 | 6/2007 | Chang et al. |
| 2007/0281086 | A1 | 12/2007 | Hsiao |
| 2008/0075954 | A1 | 3/2008 | Wardle et al. |
| 2008/0159944 | A1 | 7/2008 | Park |
| 2008/0182108 | A1 | 7/2008 | Curliss et al. |
| 2009/0075157 | A1 | 3/2009 | Pak et al. |
| 2009/0081383 | A1 | 3/2009 | Alberding et al. |
| 2010/0159240 | A1* | 6/2010 | Shah ................ B22F 3/002 428/368 |
| 2010/0178825 | A1* | 7/2010 | Shah ................ D02G 3/16 442/188 |
| 2010/0196600 | A1* | 8/2010 | Shibuya ............ B82Y 30/00 427/249.1 |
| 2010/0227134 | A1 | 9/2010 | Shah et al. |
| 2010/0260933 | A1 | 10/2010 | Malecki et al. |
| 2010/0272891 | A1 | 10/2010 | Malecki et al. |
| 2011/0124253 | A1* | 5/2011 | Shah ................ B82Y 30/00 442/60 |
| 2011/0168083 | A1 | 7/2011 | Shah et al. |
| 2011/0186775 | A1* | 8/2011 | Shah ................ C08L 25/02 252/182.32 |
| 2012/0070667 | A1* | 3/2012 | Malet ............... C01B 32/162 428/408 |
| 2012/0255494 | A1 | 10/2012 | Malecki et al. |
| 2012/0263935 | A1 | 10/2012 | Ledford et al. |
| 2012/0321544 | A1* | 12/2012 | Takai ............... B01J 23/745 423/447.3 |

FOREIGN PATENT DOCUMENTS

| | | |
|---|---|---|
| GB | 2380494 | 4/2003 |
| GB | 2458776 | 6/2010 |
| JP | H1023766 A | 1/1997 |
| JP | 2004224635 A | 8/2004 |
| JP | 2004277871 | 10/2004 |
| JP | 2005022950 | 1/2005 |
| JP | 2005059148 A | 3/2005 |
| JP | 2005263564 A | 9/2005 |
| JP | 2005350285 A | 12/2005 |
| JP | 2006062899 A | 3/2006 |
| JP | 2006143562 A | 6/2006 |
| JP | 2007161512 A | 6/2007 |
| JP | 2007252970 A | 10/2007 |
| JP | 2008230896 A | 10/2008 |
| JP | 2005029436 A | 12/2009 |
| JP | 2010189196 A | 9/2010 |
| KR | 20100123370 A | 11/2010 |
| TW | 200811032 A | 3/2008 |
| WO | 199965821 A1 | 12/1999 |
| WO | 2003072497 A1 | 9/2003 |
| WO | 2006088322 A1 | 8/2006 |
| WO | 2008/085634 | 7/2008 |
| WO | 2009/110885 | 9/2009 |
| WO | 2010099487 A1 | 9/2010 |
| WO | 2011/053458 | 5/2011 |
| WO | 2011053459 A1 | 5/2011 |
| WO | 2011054008 A2 | 5/2011 |
| WO | 2011063298 A | 5/2011 |
| WO | 2011091329 A1 | 7/2011 |
| WO | 2011109485 A1 | 9/2011 |
| WO | 2011159477 A1 | 12/2011 |

OTHER PUBLICATIONS

International Preliminary Report on Patentability for PCT/GB2015/052052 dated Jan. 17, 2017.
Office Action for EP15741270.1 dated Aug. 31, 2018.
International Search Report for PCT/GB2015/052052 dated Sep. 23, 2015.
Search Report for GB1412656.9 dated Jan. 16, 2015.
Anthoney, David B., et al., "Applying a potential difference to minimise damage to carbon fibres during carbon nanotube grafting by chemical vapour deposition", Nanotechnology, vol. 28, 2017, pp. 1-12.
H. Qian et al., "Carbon nanotube-based hierarchical composites: a review," J. Mater. Chem., 20, 4751-62 (2010).
S.A. Steiner, III et al., "Circumventing the Mechanochemical Origins of Strength Loss in the Synthesis of Hierarchical Carbon Fibers," ACS Appl. Mater. Interfaces, 5, 4892-4903 (2013).
R. Li, "Hierarchical carbon nanotube carbon fiber unidirectional composites with preserved tensile and interfacial properties," Composites Sci. and Tech. 117, 139-145 (2015).
S. Sakuri et al., "Role of Subsurface Diffusion and Ostwald Ripening in Catalyst Formation for Single-Walled Carbon Nanotube Forest Growth," J. Am. Chem. Soc., 134, 2148-53 (2012).
A. Rinaldi et al., "Dissolved Carbon Controls the Initial Stages of Nanocarbon Growth," Agnew. Chem. Int. Ed., 50, 3313-17 (2011).
Q. Zhang et al., "Hierarchical composites of carbon nanotubes on carbon fiber: influence of growth condition on fiber tensile properties," Composites Sci. and Tech., 69, 594-601 (2009).
H. Qian et al., "Hierarchical Composites Reinforced with Carbon Nanotube Grafted Fibers: The Potential Assessed at the Single Fiber Level," Chem. Mater., 20, 1862-69 (2008).
S. Reuter et al., "The kINPen—a review on physics and chemistry of the atmospheric pressure plasma jet and its applications," J. Phys. D.: Appl. Phys., 51, 233001 (2018) (51 pages).
S. Erden et al., "Continuous Atmospheric Plasma Oxidation of Carbon Fibres: Influence on the Fibre Surface and Bulk Properties and Adhesion to Polyamide 12," Plasma Chem Plasma Process, 30, 471-87 (2010).
D.B. Anthony et al., "Applying a potential difference to minimise damage to carbon fibres during carbon nanotube grafting by chemical vapour deposition," Nanotechnology, 28, 305602 (2017) (12 pages).

(56) References Cited

OTHER PUBLICATIONS

D.B. Anthony et al., "Continuous carbon nanotube synthesis on charged carbon fibers," Composites Part A, 112, 525-38 (2018).

* cited by examiner

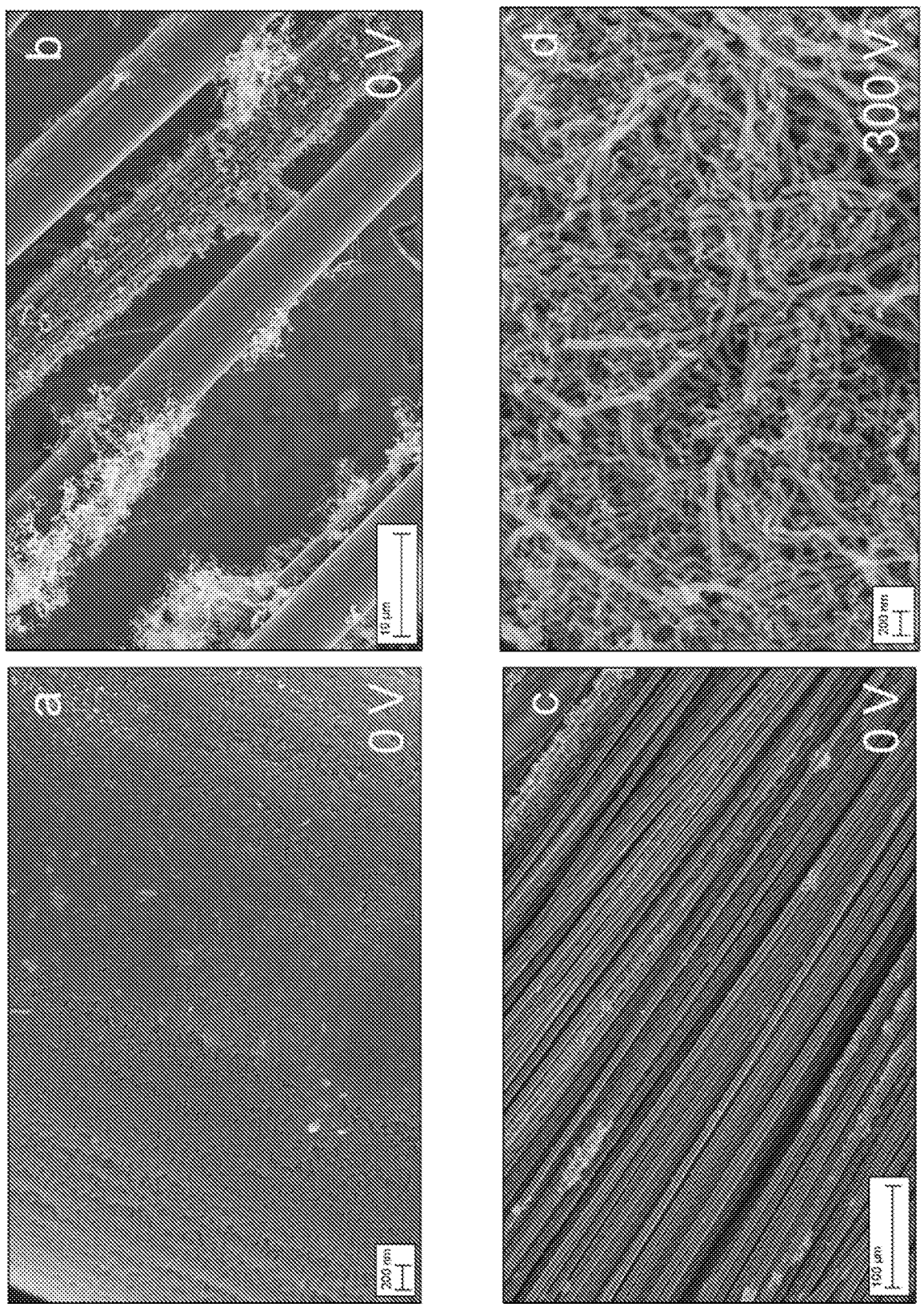
Fig. 3.1

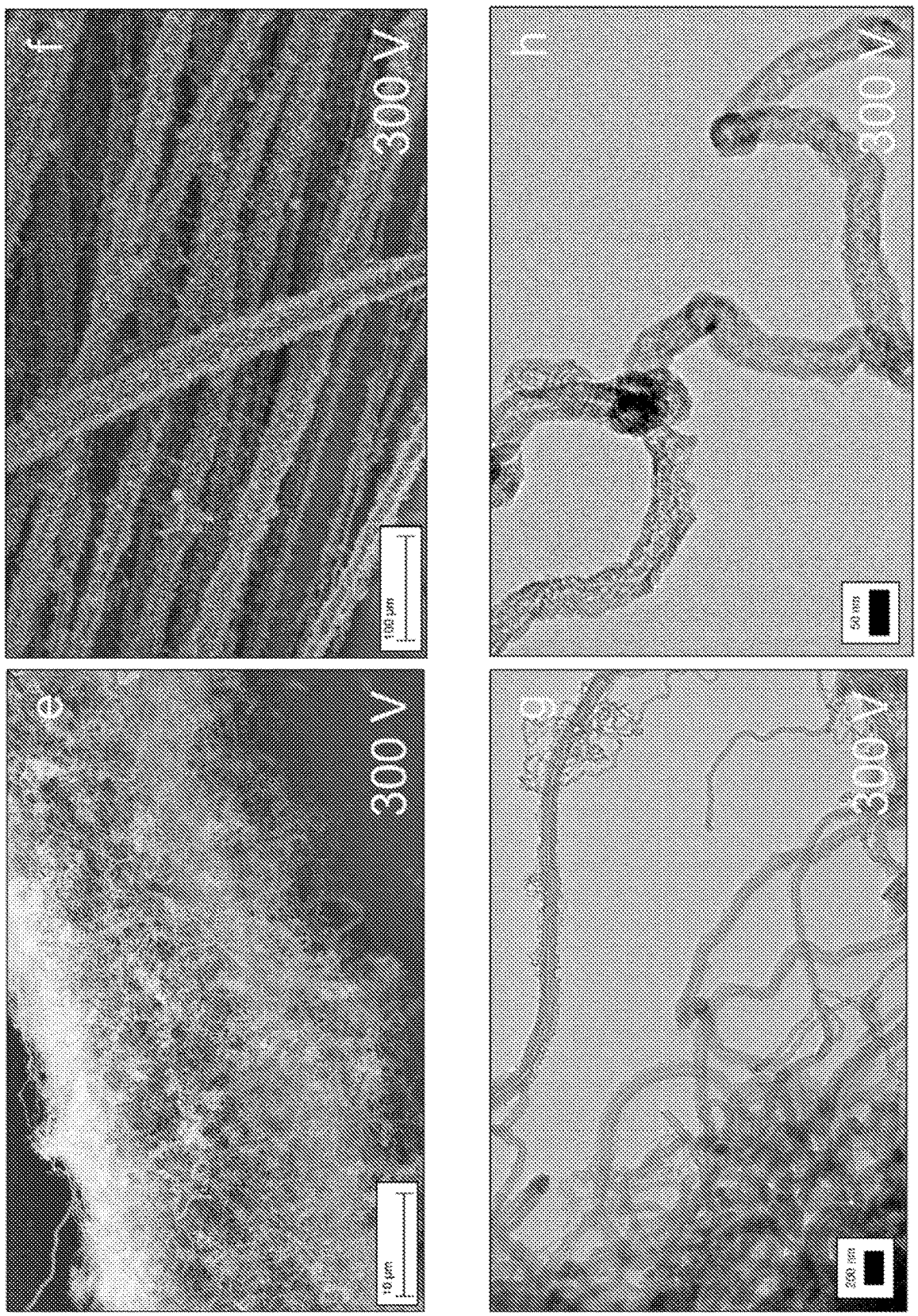
Fig. 3.1 (cont.)

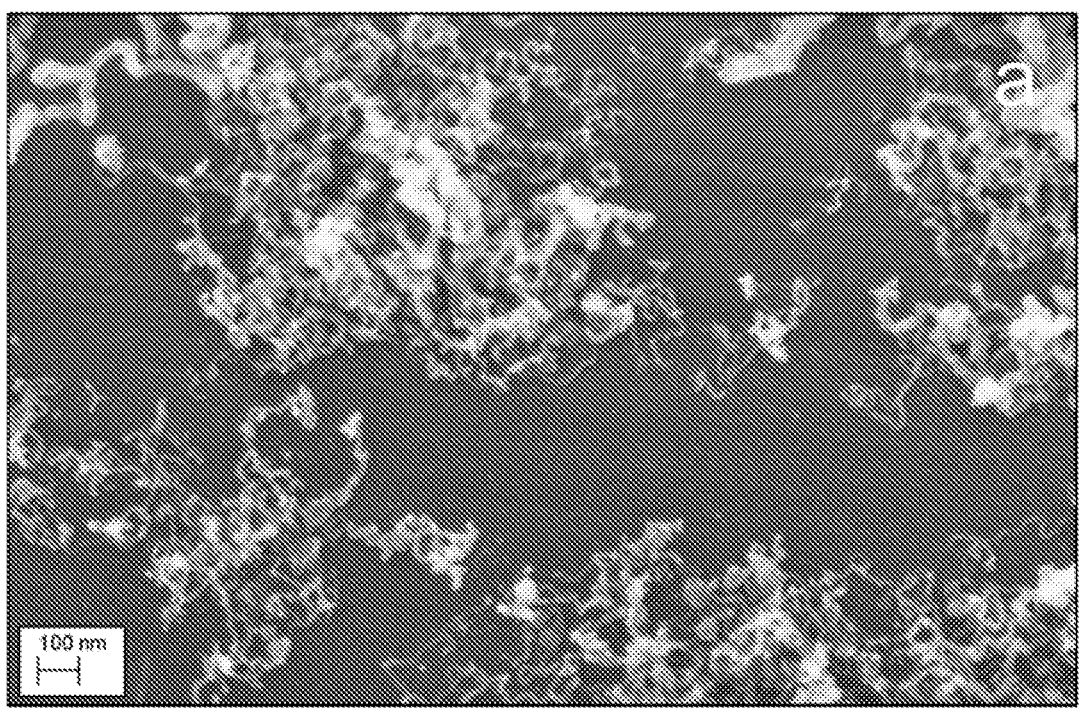
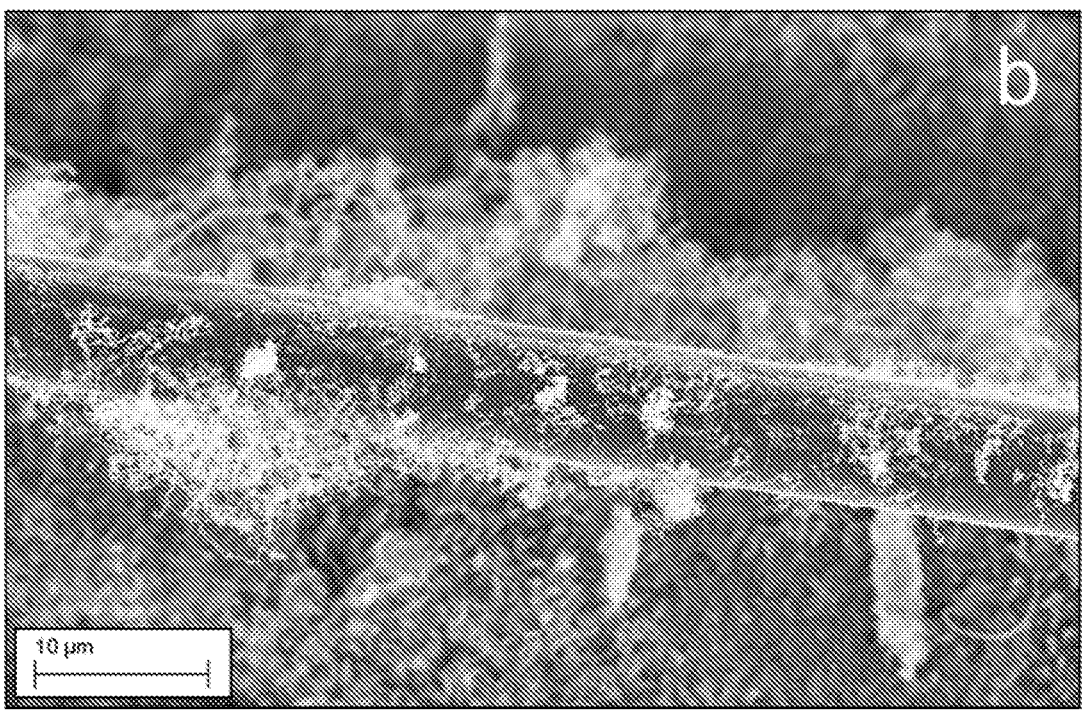
Fig. 3.2

PROCESS FOR PRODUCING CARBON-NANOTUBE GRAFTED SUBSTRATE

CROSS REFERENCE TO RELATED APPLICATIONS

This U.S. nonprovisional application is the 35 USC § 371 national phase of PCT Application No. PCT/GB2015/052052, filed on Jul. 15, 2015, which claims the benefit of GB Application No. 1412656.9, filed on Jul. 16, 2014. Each of these documents is hereby incorporated by reference in its entirety.

The present invention relates to a process for producing a carbon nanotube (CNT)-grafted substrate.

BACKGROUND

The grafting of carbon nanotubes (CNTs) to a substrate, for example a carbon fibre material, can serve many functions including, for example, as a coating to protect against damage from abrasion, and compression. Carbon fibres (CFs) have wide applicability as components of fibre-reinforced composite materials. The growth/grafting of CNTs onto reinforcing CF surfaces can serve as an interface between the substrate and matrix material in a composite to improve composite structural performance, through improved interfacial bonding of the matrix and the CF reinforcement. Grafted CNTs improve compatibility with a resin matrix, in terms of wetting and adhesion. Grafting of CNTs also provides opportunities not found with traditional sizings to enhance transverse properties, both mechanical (strength, stiffness, etc) and functional (thermal/electrical conductivity, solvent resistance, etc).

Methods of incorporating CNTs into fibre reinforced matrices include infiltrating CNT-loaded resins and depositing pre-grown CNTs on fibres by wet processes such as coating of aqueous dispersions. Undesirably, however, these processes generally result in CNTs parallel to a primary fibre surface. In the former method loading fractions which can be incorporated are limited to 2 wt % due to increase in viscosity and self-filtration. An alternative approach is growing CNTs onto a fibre surface. This latter method is generally carried out by chemical vapour deposition, mitigates CNT loading issues. Chemical vapour deposition (CVD) is a process by which CNTs may be grown on a substrate. CVD involves preparing a substrate with a layer of transition metal catalyst particles. The substrate is heated to approximately 700° C. and exposed to a carbon feedstock gas (containing carbon monoxide or a hydrocarbon or hydroxyl-substituted hydrocarbon such as acetylene, ethylene, ethanol and methane) and a reductive gas (such as hydrogen, or ammonia) with an inert carrier gas (such as helium, nitrogen or argon). Decomposition of the carbon-feedstock gas at the surface of the catalyst particle by a nucleation process leads to growth of CNTs.

Growth of CNTs on carbon-substrates is not as well investigated as growth on silica, alumina and metal substrates as it is inherently more difficult to grow CNTs on a substrate which dissociates into the catalyst. Dissociation of the substrate material can damage of the substrate structure. The synthesis of CNTs from a catalyst on a carbon substrate, leads to competition with the absorption of carbon of the substrate over the carbon feedstock and typically leads to pitting of the surface. Reactions between catalyst and substrate may also occur during catalyst activation (usually under reducing gases), simple heating, or due to interaction with synthesis by-products.

Prior art processes have utilised a barrier coating between a CF substrate and the synthesised CNTs (WO2011/053458), but this can provide a weak interaction between the CNTs and the substrate. Typical barrier layers comprise alumina, glass, alkoxysilane, methylsiloxane, or an alumoxane. Some prior art processes, such as WO2011/053458, utilise a plasma-enhanced CVD (PE-CVD) process. The presence of a plasma alters CNT growth kinetics. PE-CVD results in increased CNT growth but normally with a trade off with a poorer quality of CNTs synthesised. Typical CVD of aligned CNTs arrays on substrates produces CNTs in the order of tens of microns in length, which is undesirable in fibre composites due to the need to pack fibres close together.

The present invention provides a process for grafting CNTs to a substrate which avoids damage to the structure of the substrate, does not require barrier coating of the substrate, produces short, small diameter CNTs, can be used as a continuous process at atmospheric pressure, does not require generation of a plasma and which can be used as part of an in line manufacturing process.

SUMMARY OF THE INVENTION

In a first aspect, the invention provides a process for producing a carbon nanotube-grafted substrate, the process comprising:
a. providing a substrate having catalytic material deposited thereon; and
b. synthesising carbon nanotubes on the substrate by a chemical vapour deposition process in a reaction chamber;

characterised in that the process comprises providing a counter electrode, applying a potential difference to the substrate in relation to the counter electrode and maintaining the potential difference of the substrate in relation to the counter electrode during the chemical vapour deposition process.

In a second aspect, the invention provides a carbon nanotube-grafted substrate produced by a process according to the first aspect of the invention.

In a third aspect, the invention provides an apparatus for grafting carbon nanotubes to a substrate, the apparatus comprising a reaction chamber, means for positioning a substrate having catalytic material deposited thereon in the reaction chamber, a counter electrode, means for applying a potential difference to the substrate in relation to the counter electrode, heating means and means for exposing the substrate to a carbon feedstock gas and a reductive gas.

BRIEF DESCRIPTION OF THE DRAWINGS

The invention may be put into practice in various ways and a number of specific embodiments will be described by way of example to illustrate the invention with reference to the accompanying figures, in which:

FIG. 3.1 shows a scanning election microscope (SEM) image of batch carbon nanotube-grafted carbon fibre with no potential difference applied to the substrate (batch CNT-g-CF (0V) and with an applied potential difference ((batch CNT-g-CF 300V)). SEM images (a) to (c) are CNT-g-CF synthesised without the application of a potential difference (0 V), (d) to (f) & transmission electron microscopy (TEM) images (g) & (h) are CNT-g-CF synthesised under an applied potential difference of 300 V. FIG. 3.2 shows SEM images batch CNT-g-CF synthesised under an applied potential difference of 300 V with the CF surface visible.

DETAILED DESCRIPTION

Figure 1:
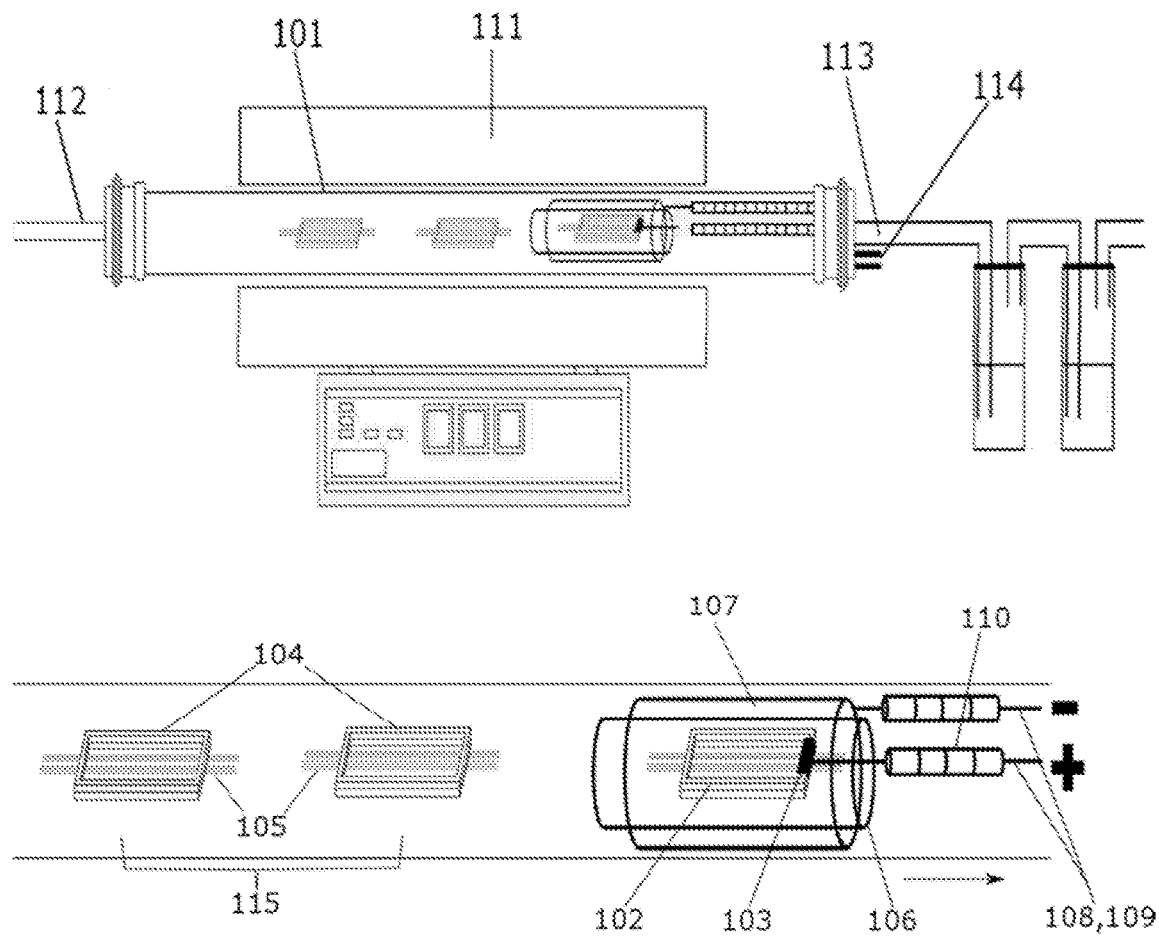
FIG. 1 shows a schematic diagram of a batch CVD set-up with potential difference applied to the substrate during CNT-synthesis and an overview of the set up with arrangement of fibre substrates in frames and electrical connections with a close up of the substrates held in frames.

The present disclosure is directed to a process as described herein for grafting carbon nanotubes on a substrate by a chemical vapour deposition (CVD) process, wherein the substrate has a potential difference in relation to a counter electrode during the CVD process. The substrate may be a fibre material, preferably a carbon fibre material or a carbon fibre precursor.

The meanings of terms used herein are explained below, and the present invention will be described in detail.

As used herein, a "fibre material" refers to a single fibre (filament) or any material comprising a plurality of fibres as the elementary structural component, such as a multi-filament, yarn, tow, rod, panel, braid, ribbon, tape, woven or non-woven fabric, ply, mat, roving, or mixture thereof, and the like. A tow comprises a bundle of untwisted filaments. A yarn comprises a bundle of twisted filaments. Tapes or ribbons may comprise woven fibres or non-woven flattened tows. Primary fibre materials may be assembled into fabric or sheet-like structures, woven fabrics and non-woven mats. Any of such fibre materials may serve as the substrate in the process of the invention.

As used herein, "carbon fibres" refer to fibres with a carbon content of at least 92 wt %. Carbon fibres may be made from a polymeric precursor, pitch, or from carbon allotrope building blocks. Carbon fibres may comprise a graphitic or non-graphitic structure.

Carbon fibres may be generated, for example, from a polymer starting material such as polyacrylonitrile (PAN), which undergoes a process comprising cyclization, oxidation, carbonization and optionally graphitization to form carbon fibres. Carbon fibres may also be generated from starting materials such as cellulose fibres, pitch, lignin, polyethylene, which undergo various processing steps, such as stabilization and oxidation, prior to carbonization and graphitization, to form carbon fibres. In the context of the invention described herein a carbon fibre precursor is a starting material as described above as modified at any stage of processing to produce a carbon fibre, wherein it will be appreciated that a carbon fibre precursor is suitable for use as a substrate in the process of the invention if it is capable of having a potential difference applied thereto, i.e. a carbon fibre precursor that has undergone sufficient carbonization to be conductive. A carbon fibre precursor may therefore be a carbon-containing fibre material which is electrically conductive.

The processes described herein allow for the continuous production of carbon nanotubes of uniform length and distribution along spoolable lengths of tow, tapes, fabrics and other 3D woven structures. While various mats, woven and non-woven fabrics and the like can be functionalized by processes of the invention, it is also possible to generate such higher ordered structures from the parent tow, yarn or the like after CNT functionalization of these parent materials. For example, a CNT-infused woven fabric can be generated from a CNT-infused carbon fibre tow.

As used herein, a material having "spoolable dimensions" refers to a material having at least one dimension that is not limited in length, allowing for the material to be stored on a spool or mandrel.

As used herein, the term "carbon nanotube" (CNT) refers to any cylindrically-shaped allotrope of $sp^2$ carbon including single-walled carbon nanotubes (SWNTs), double-walled carbon nanotubes (DWNTs), multi-walled carbon nanotubes (MWNTs). Carbon nanoforms associated with carbon nanotubes include singlewalled, multiwalled, scrolled, full-core, herringbone, cupstacked, cone, platelets, toroid, spirals, coiled nanoform, fibrils, ribbon, rods, or mixtures thereof. The process and apparatus of the invention are of particular use for growing MWNTs, wherein the MWNTs comprise graphitic layers substantially parallel to the fibre axis.

As used herein, the term "grafted" means bonded and "grafting" means the process of bonding. Such bonding may involve direct covalent bonding, ionic bonding, pi-pi, and/or van der Waals force-mediated physisorption of a mixture thereof. In the process of the invention, grafting of CNTs to a substrate is achieved by growing CNTs from catalyst deposited on the substrate surface. The process of the invention as described herein does not require the provision of a barrier layer between the substrate and the grafted CNTs. Accordingly, the CNTs may be directly bonded to the substrate or indirectly bonded through intervening residual catalytic material (e.g. transition metal). Preferably, no material other than catalytic material is present between the CNTs and the substrate.

As used herein, an "inerting gas" may be nitrogen, a group 18 noble gas, or a mixture thereof, preferably nitrogen, argon, helium or a mixture thereof.

As used herein, a "hydrocarbon" is an organic compound consisting entirely of hydrogen and carbon. A hydrocarbon may be straight chain, branched, cyclic, saturated, partially unsaturated, aromatic or any combination thereof.

As used herein, a "nanomaterial" a materials with at least one dimension in the size range up to 1000 nm, preferably up to 100 nm.

As used herein, a "graphite foil" is a sheet material comprising compacted graphite.

As used herein, an "electric field" as generated in the process or apparatus of the invention is an electric field $(Vm^{-1})$ between the substrate and the counter electrode, calculated on the basis of the equation:

electric field=$V/z$

In this equation, V is the voltage applied between the substrate and the counter electrode and z is the minimum distance (m) between the substrate and the electrode in the set-up of the process or apparatus.

As used herein, the "power density" of a process or apparatus of the invention is a power density $(Wcm^{-3})$ calculated on the basis of the equation:

power density=current×voltage/volume

In this equation, current is the total current (A) in the capacitor circuit of the process or apparatus, voltage (V) is the voltage applied between the substrate and the counter electrode and volume is the volume $(cm^{-3})$ enclosed by counter electrode.

As used herein, the "current density on the cross section of the substrate" is the current density (Acre) calculated on the basis of the equation:

current density=current/CSA

In this equation, current is the total current (A) in the capacitor circuit of the process or apparatus and CSA is the cross sectional area $(cm^{-2})$ of the substrate.

As used herein, the "current density on the counter electrode surface area" is the current density $(Acm^{-2})$ calculated on the basis of the equation:

current density=current/counter electrode surface area

In this equation, current is the total current (A) in the capacitor circuit of the process or apparatus and counter electrode surface area is the surface area of the surface of the counter electrode facing the substrate.

As used herein, "atmospheric pressure" is taken to be 1 bar (i.e. 100,000 Pa). A pressure of no further than 0.5 bar either way from atmospheric pressure equates to a pressure of about 50,000-150,000 Pa.

As used herein, the term "comprises" means "includes, but is not limited to" any specified constituent component, process step or the like. The term "comprises" encompasses, without limitation, instances which "consist essentially of" any specified constituent component, process step or the like.

In a first aspect, the present invention is directed to a process for producing a carbon nanotube-grafted substrate, the process comprising:
a. providing a substrate having catalytic material deposited thereon; and
b. synthesising carbon nanotubes on the substrate by a chemical vapour deposition process in a reaction chamber;

characterised in that the process comprises providing a counter electrode, applying a potential difference to the substrate in relation to the counter electrode and maintaining the potential difference of the substrate in relation to the counter electrode during the chemical vapour deposition process.

The substrate is preferably a fibre material or a sheet material. In the context used herein, a fibre material (e.g. a carbon-containing fibre material) refers to a single fibre (filament) or any material comprising a plurality of fibres as the elementary structural component, such as a multi-filament, yarn, tow, rod, panel, braid, ribbon, tapes, woven or non-woven fabric, ply, mat, roving, or mixture thereof, and the like. Where the substrate comprises a plurality of fibres, the applied potential difference causes repulsion between the fibres and consequently separation of the fibres, facilitating even growth of CNTs on the fibres. This addresses uneven CNT deposition observed in the absence of an applied potential difference, due to difficulty diffusing gases through dense fibre preforms and/or due to bald spots created where fibres contact. A sheet material may comprise, for example, a graphite sheet, graphite foil, a graphene sheet, a metal sheet or the like.

The CNTs may be grown directly on the substrate. Accordingly, the grafting may be directly between the CNT and the substrate or deposited catalytic material, with no barrier layer present therebetween. Typical barrier layers comprise, for example, alumina, glass; alkoxysilane, methylsiloxane, or an alumoxane. In the present invention, a barrier layer (e.g. alumina, glass, alkoxysilane, methylsiloxane, or an alumoxane) may be absent. The CNTs grow in an orientation substantially perpendicular to the longitudinal axis of the substrate.

The CNTs may be any type of CNT, for example multi-walled CNTs. The diameter of CNTs grown may be from 0.1 to 1000 nm, from 1 to 500 nm or from 1 to 200 nm. The CNT diameter can be constant or vary along CNT length. CNTs can be grown at various lengths, determined by residual time in carbon nanotube CVD synthesis conditions. The CNT length may, for example, be from 5 nm to 10 mm, from 5 nm to 20 μm, from 50 nm to 1 μm, or from 100 nm to 1 μm.

In the process of the invention a potential difference is applied to the substrate in relation to a counter electrode. Thus, the substrate may be conductive and comprise electrically conductive material. Accordingly, the substrate may be formed of an electrically conductive material which is charged and acts as an electrode during the CVD process. In the process of the invention, the potential difference is maintained (i.e. remains present) during the CVD process. Charge may be applied directly to the substrate by connection of the substrate to an electrical source. The substrate and the counter electrode may be arranged to form a capacitance circuit during operation of the CVD process, wherein the substrate and the counter electrode act as the two plates (electrodes) of a capacitor, respectively. During operation of the CVD process, there is a potential difference between the two electrodes of the capacitor. The counter electrode may be of a configuration (e.g., tubular) surrounding the substrate, with the substrate positioned within the counter electrode. The charge on the capacitor electrodes may slowly discharge, as for capacitors in general. Ideally, current flow through the space between the electrodes is low and leakage of charge is minimised. To maintain a constant potential difference a low level current may be applied to the substrate.

As determined by cross sectional area of the substrate, in some embodiments the current density on the cross section of the substrate does not exceed 50 $Acm^{-2}$, 25 $Acm^{-2}$, 10 $Am^{-2}$, 5 $Acm^{-2}$ or 3 $Acm^{-2}$. In some embodiments, the current density on the counter electrode surface area may not exceed $10 \times 10^{-4}$ $Acm^{-2}$, $6 \times 10^{-4}$ $Acm^{-2}$, $10 \times 10^{-5}$ $Acm^{-2}$, or $6 \times 10^{-5}$ $Acm^{-2}$.

In a process of the invention, the power density may preferably be 1 $Wcm^{-3}$ or less, 0.5 $Wcm^{-3}$ or less, 0.2 $Wcm^{-3}$ or less, or 0.05 $Wcm^{-3}$ or less.

The substrate may be a carbon-containing substrate. Accordingly, wherein the substrate is a fibre material as described above, it may be a carbon-containing fibre material, including a carbon fibre or a carbon fibre precursor, for example in the form of a tow. Wherein the substrate is a sheet material, the substrate may be a graphite sheet, graphite foil, or a graphene sheet, or may comprise a plurality of graphite or graphene sheets. A particular benefit of the process of the invention wherein the substrate is a carbon-containing substrate is that the application of a potential difference to the substrate prevents dissociation of the underlying substrate structure, which is observed for carbon-containing substrates in the absence of an applied potential difference.

In the process described herein, the substrate may comprise a partially carbonised PAN-precursor fibre. Partial carbonisation of precursor fibre should be sufficient such that the fibre is conductive. The fibre may be non-graphitic, i.e. provided before final graphitisation.

In an alternative embodiment, the fibre material of the substrate may comprise metal fibres.

The potential difference applied to the substrate in relation to the counter electrode may be positive or negative. The potential difference applied to substrate may between 0.1 volts and 30 000 volts, preferably between 100 and 1000 volts, more preferably between 200 and 400 volts. Variation of the potential difference is avoided during the CVD process, with variation preferably kept within a range of 20, 10, 5 or 1 volts either way of an applied potential difference. The potential difference may be kept constant during the CVD process. The potential difference may be applied to the substrate within the reaction chamber or outside the reaction chamber. This may be applied by connection of the substrate to an electrical power source, wherein connection may achieved, for example by connection of a wire to the substrate and a power source, or by placing the substrate in contact with a power source to enable it to become charged before moving within or into the reaction chamber. If applied outside the reaction chamber, the potential difference is maintained within the reaction chamber, during the CVD process. The substrate may be positive and the counter electrode negative. The potential difference may be applied at a level such that no plasma is generated during operation of the CVD process. The applied potential difference may generate an electric field of 1 $V\mu m^{-1}$ or less, 0.5 $V\mu m^{-1}$ or less, 0.2 $V\mu m^{-1}$ or less, 0.1 $V\mu m^{-1}$ or less, or 0.07 $V\mu m^{-1}$ or less. The electric field may be at least 0.01 $V\mu m^{-1}$.

The counter electrode may be of a configuration (e.g., tubular) surrounding the substrate, with the substrate positioned within the counter electrode. In this configuration, the counter electrode is open at two ends, enabling the substrate to be passed through the counter electrode. The counter electrode may comprise graphite, for example a graphite foil, or a metal alloy. It will be appreciated that the metal alloy should be selected to be heat resistant and stable under the CVD synthesis conditions employed.

The chemical vapour deposition process may comprise exposing the substrate to a reductive gas and a carbon feedstock gas at elevated temperature. The chemical vapour process is preferably carried out with the addition of an inert carrier gas to give an otherwise inert atmosphere. The chemical vapour deposition process may be carried out at a temperature in the range of 400° C. to 1200° C., preferably at least 600° C., e.g. 650-850° C. Heating may be carried out by a furnace, e.g. by coil, rod, with the furnace optionally surrounding the reaction chamber. Heating may occur prior to application of a potential difference to the substrate. Other means of heating include radiofrequency, microwave and resistive heating.

The reductive gas may comprise hydrogen. The reductive gas may be provided as a mixture of the reductive gas with an inerting gas, preferably at a percentage of less than 15% by volume of reductive gas in inerting gas. This percentage is sufficiently low to exclude auto ignition in mixtures of environmental gas at elevated temperatures.

The carbon feedstock gas may comprise a hydrocarbon, hydroxyl-substituted hydrocarbon or carbon monoxide, or a mixture of two or more hydrocarbons, hydroxyl-substituted hydrocarbons or carbon monoxide, in gaseous form. The hydrocarbon or hydroxyl-substituted hydrocarbon is preferably a $C_{1-12}$, preferably a $C_{1-8}$ hydrocarbon or hydroxyl-substituted hydrocarbon. For example, the carbon feedstock gas may comprise acetylene, ethanol, methane, ethane, ethylene, propane, toluene, xylene, carbon monoxide or a mixture thereof.

The carbon feedstock gas may be provided as a mixture with an inerting gas, preferably at a percentage of less than 15% by volume of reductive gas in inerting gas. This percentage is sufficiently low to exclude auto ignition in mixtures of environmental gas at elevated temperatures.

The reaction chamber may comprise one or multiple gas injection points. The use of inerting gas limits environmental gas inclusion at openings of the reactor, and in the central region or regions. Inerting gas also aids cooling of the substrate at the entrance/exit of the reaction chamber. The flow of reductive and carbon feedstock gases may be varied, independently, between 1 standard cubic centimetres per minute and 50 litre per minute.

The process described herein does not require a low pressure/vacuum environment for the CVD reaction. Accordingly, the CVD reaction may be carried out at atmospheric pressure, or higher or lower than atmospheric pressure. Preferably the pressure is slightly higher or lower than atmospheric pressure, e.g. no further than 0.5 bar either way. Preferably, the CVD reaction may be carried out at a pressure higher than atmospheric pressure (e.g. up to 2 bar, or up to 1.5 bar). This aids in avoiding air being drawn into the reaction chamber.

The reaction chamber may have at least one opening to environmental gas, and can contain multiple openings.

The catalytic material, which is a CNT-forming catalytic material, may be a d-block transition metal-containing catalytic material or a non-metal seed catalyst, or a mixture thereof.

Where the catalytic material is a d-block transition metal-containing catalytic material it may comprise a d-block transition metal or an alloy or non-alloy mixture of d-block transition metals, in elemental form, in salt form or as a coordination complex with an organic ligand, and mixtures thereof. Such salt forms include, without limitation, oxides, carbides, and nitrides. Non-limiting exemplary transition metals include Ni, Fe, Co, Mo, Cu, Pt, Au, Pd, Y and Ag. The catalytic material may comprise, without limitation, iron (II) acetylacetone, iron (III) acetylacetone, nickel (II) acetylacetone, cobalt (II) acetylacetone, cobalt (III) acetylacetone, iron (III) nitrate, nickel (II) nitrate, cobalt (II) nitrate, cobalt (III) nitrate, or a mixture thereof.

Where the catalytic material is a non-metal seed catalytic material, it may comprise silicon oxide, silicon, silicon carbide, germanium, carbon, diamond, amorphous carbon, aluminium oxide, zirconium oxide, carbon nanotubes or any other $sp^2$ carbon nanomaterial, or a mixture thereof.

The process may additionally comprise the step of forming the substrate having catalytic material deposited thereon by depositing catalytic material on a substrate material. Depositing may be carried out by applying catalytic material in a solvent to a substrate material. Deposition may be carried out by a process such as, without limitation, spraying, dip coating, impregnation, incipient wetness or a combination thereof.

For applying the catalytic material to the substrate, any solvent that allows the catalytic material to be dispersed therein may be used. Such solvents can include, without limitation, ethanol, methanol, water, acetone, isopropanol, hexane, toluene, tetrahydrofuran (THF), cyclohexane, or a mixture thereof.

In an alternative approach, catalytic material may be deposited on a substrate material by a gas phase deposition process, for example by exposing substrate to a gaseous source of metal such as iron pentacarbonyl.

The CVD process may be performed in a batchwise fashion.

Alternatively, the CVD process may be a continuous process. A CVD process performed in a continuous fashion, is one whereby CNTs are grafted continuously along a spoolable length of substrate. The chemical vapour deposition process may be a continuous process, wherein the substrate is moved through the reactor sequentially allowing reduction of carbon feedstock gas and synthesis of carbon nanotubes to occur in-situ, continuously along a length of the substrate.

The substrate may be moved through the reaction chamber at constant speed, or allowed to dwell in a specific region or regions within reaction chamber. The process may comprise providing substrate on a spool, wherein substrate is fed into the reaction chamber from the spool and, after passing through the reaction chamber, taken up on a collection spool. Movement of the substrate may be controlled by a mechanical motor winder which may be tension controlled.

The residual time of any specific portion of the substrate within the reaction chamber may be between 0.1 and 10000 seconds. The residual time may be at least 300 seconds or at least 900 seconds.

Deposition of catalytic material on the substrate may be continuously applied in-line with continuous chemical vapour deposition reactor. After deposition and prior to the CVD process, the deposited catalytic material can be treated, for example dried in inert conditions by a furnace, or infra-red radiative heater, in-line.

Continuous manufacturing of carbon nanotube grafted continuous substrate may proceed indefinitely, as long as enough source materials are supplied to the reactor, and sooting pyrolysis of carbon feedstock is adequately controlled.

The process as described herein may comprise one or more steps of further processing of the CNT-grafted substrate subsequent to CVD. Further processing steps may be applied for suitability of an intended end use of the CNT-grafted substrate. The further processing may comprise one or more of plasma treatment, surface roughening through chemical or oxidative processes (e.g. carried out using potassium hydroxide), application of a barrier coating, sizing, heat treatment, chemical functionalization, resin impregnation or impregnation with epoxy. Heat treatment may include graphitisation and/or carbonisation. This may be particularly beneficial to enhance strength of bonding of the CNTs to the substrate, particularly where the substrate is a carbon fibre material or carbon fibre precursor. A benefit of the process of the invention is that CVD to graft CNTs may be carried out as a step within an inline production process, for example as one step within an in-line process for the production of CNT-grafted carbon fibres from starting materials.

Collection of carbon nanotube grafted continuous substrate may be made in environmental atmosphere, or in inerting regions, or mixture thereof.

In the process described herein, the substrate may be protected using a coating to prevent, damage, agglomeration of catalytic material, or it may be used without a coating.

In a second aspect, the invention provides a carbon nanotube-grafted substrate produced by a process according to the first aspect of the invention. The carbon-nanotube-grafted substrate may be for use as a reinforcing element in composites, a catalyst support, an electrode, or an electromagnetic wave absorber/reflector.

In a third aspect, the present invention provides an apparatus for grafting carbon nanotubes to a substrate, the apparatus comprising a reaction chamber, means for positioning a substrate having catalytic material deposited thereon in the reaction chamber, a counter electrode, means for applying a potential difference to the substrate in relation to the counter electrode, heating means and means for exposing the substrate to a carbon feedstock gas and a reductive gas. The apparatus may be for performing a process according to the first aspect of the invention as described herein.

In the apparatus, the substrate and the counter electrode may both be connected to an electrical source, such that during operation a capacitance circuit is formed with the substrate acting as one electrode of a capacitor and the counter electrode acting as the other electrode of the capacitor.

The apparatus may comprise means for moving the substrate through the reaction chamber. This allows CNT grafting to occur as a continuous process. The means for moving the substrate through the reaction chamber may comprise a spool, creel or reel. The apparatus may comprise a mechanical motor to drive movement of the substrate. The apparatus may further comprise a means for gas exchange. The apparatus may comprise zones, with apertures present between the zones and means for supplying a gas (gas inlets) to each zone. This enables a different gas environment to be provided in each zone.

The counter electrode may be a tubular component, for example formed of a graphite foil. The heating means may be a furnace, for example a coil, rod or induction furnace or IR heater. The heating means may comprise means for application of a current to the substrate to provide direct electrical heating. The apparatus may further comprise a collection spool for taking up substrate after passing through the reaction chamber. The apparatus may comprise a shielding means for shielding the substrate from the counter electrode. This may, for example, comprise an insulating material, such as quartz, positioned between the substrate and the counter electrode.

The means for applying a potential difference to the substrate may comprise a wire connection to an electrical source or a conductive member (such as a metal pin) connected to a power source, whereby the substrate may be placed in contact with the conductive pin to enable it to become charged before moving within or into the reaction chamber.

The means for exposing the substrate to a carbon feed gas and a reductive gas may comprise one or more gas inlets into the reaction chamber. The apparatus may further comprise one or more gas outlets for exit of gas from the reaction chamber.

The substrate, carbon feed gas, reductive gas and counter electrode may be as defined in respect of the first aspect of the invention.

All features of each of the aspects of the invention as described above can be applied to the other aspects of the invention mutatis mutandis.

In the process of the invention, the potential is applied directly to the substrate (e.g. carbon fibres) and this does not need to be carried out under vacuum, in contrast to many plasma-enhanced CVD processes. The electrostatic field on a fibrous substrate spreads fibres due to mutual repulsion. Significantly, everywhere in the substrate (e.g. a CF tow) is set to the same, well defined voltage. Spreading is useful as it provides space for gas access and uniform CNT growth. The electrostatic charge is also applied to the growing CNTs (and catalyst particles), causing them to repel on another, which helps their alignment and growth. The use of plasma CVD often grows defective nanotubes and can etch the growing material. In contrast, in the process of the invention thermal CVD may be used. Running a process at near ambient pressure increases processing convenience and ease of integration into other process steps, for example in an in-line manufacturing process. For example, the process may be integrated with a process comprising conventional PAN fibre processing.

The nanotubes grown by a process of the invention are small diameter and conveniently short (short enough not to reduce fibre packing fraction in a final composite use). The dimensions provide high surface area and may offer improved mechanical properties. In addition, fibre damage is avoided without a barrier layer, whilst enabling the growth of true multiwalled nanotubes. Previous work either has tended to damage the CF properties or produce less desirable herringbone or platelet nanofibres rather than MWNTs. The advantage of the current invention is likely to accrue from the directly applied potential helping to maintain separate catalyst particles.

An apparatus for performing a batch process of the invention is shown in FIG. 1. The apparatus comprises a reaction chamber 101 within which is positioned a frame 102 holding the substrate 103, e.g. a CF electrode. In the illustrated embodiment, additional frames 104 are also present for holding control samples 105 (with no potential difference applied), although these additional frames and control samples are not essential. The substrate 103 and frame 102 are positioned within a shielding quartz tube 106. This tube may be present between the counter electrode 107, e.g. a graphite foil, and the substrate 103 to prevent stray substrate fibres discharging the circuit. Around the quartz tube 106 is located the counter electrode 107, in the illustrated embodiment a tubular graphite foil. Connections of the substrate 103 and the counter electrode 107 to an electrical source are made by wires 108, 109, shielded by ceramic beads 110 to avoid shorting. The apparatus comprises a heating source (furnace) 111 an inlet 112 for carbon feedstock and reductive gases and a gas exhaust/outlet 113. Connections to the circuit are denoted as 114. Control samples are denoted as 115. The arrow represents flow direction.

Figure 2:
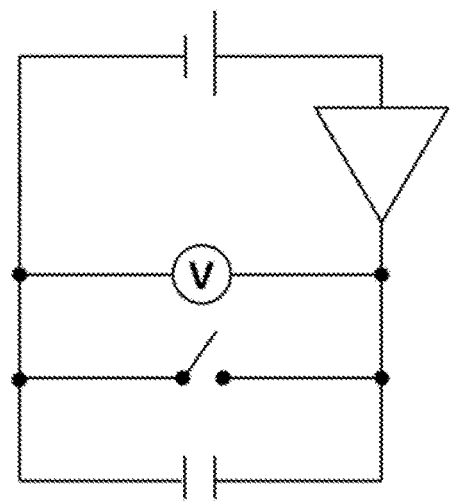
FIG. 2 shows a circuit diagram for a set-up with potential difference applied to the substrate. The set-up has an amplifier, CF electrode on the positive capacitor plate and graphite foil as the counter electrode. The inclusion of the switch ensures complete discharge from the set-up after CNT growth.

The apparatus shown in FIG. 1 forms a capacitance circuit during operation when a potential difference is applied, with the substrate 103 and the counter electrode 107 acting as the two plates of the capacitor. FIG. 2 is a circuit diagram representing the capacitance circuit formed.

Figure 7:
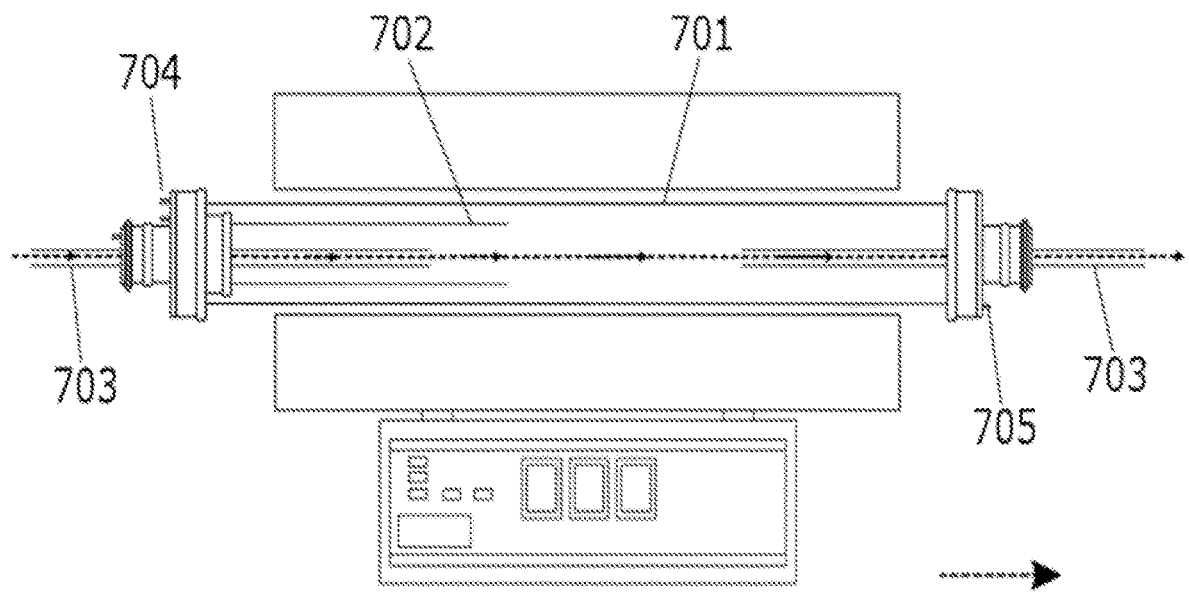
FIG. 7 shows a schematic of the continuous CVD set-up with concentric quartz tubes.
Figure 8:
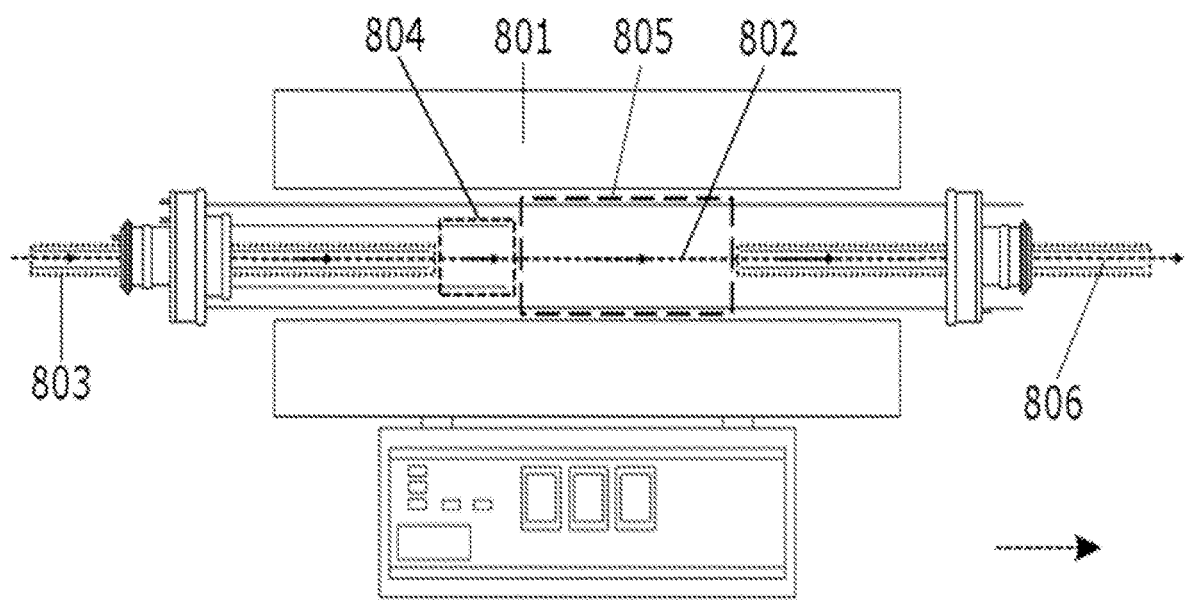
FIG. 8 shows a schematic of the various reaction zones determined by the quartz tube length (more clearly seen in FIG. 7) and pulling speed of the fibre tow through the furnace.

An apparatus for performing a continuous process of the invention is shown in FIGS. 7 and 8. The apparatus comprises concentric quartz tubes. Quartz outer tube 701 (51.0±0.5 OD, 2.5±0.2 wall thickness) supports the concentric tubes, middle tube 702 (25.0±0.2 OD, 1.5±0.2 wall thickness) and inner tube 703 (19.0±0.3±0.5 OD, 1.5±0.2 wall thickness) in a cantilever arrangement. The small dashes at the ends of the connections are gas inlet/outlet positions 704, 705. The apparatus is kept at room environment. In the illustrated embodiment, 701 is a fixed outer 2" tube, 702 is a fixed middle tube, 703 is an inner tube with a variable position. FIG. 8 shows a schematic of the various reaction zones determined by the quartz tube length (more clearly seen in FIG. 7) and pulling speed of the fibre tow through the furnace 801. Substrate 802 is pulled though the multi-zone reactor from left to right, initially heating substrate 802 fibres in inert atmosphere to reaction temperature (zone $C_{left}$ 803), reduction of catalytic material then occurs at reaction temperature in zone B 804, and CVD CNT-synthesis occurs in zone A 805. Finally cooling of substrate occurs in an inert atmosphere (zone $C_{right}$ 806) and CNT-grafted substrate is collected at room temperature. In the illustrated embodiment, Zone C 803 and 806 are within an inert gas sleeve. The arrows in FIGS. 7 and 8 represent the direction of substrate feed through the reaction chamber.

EXAMPLES

The examples show the improved synthesis of carbon nanotubes (CNTs) on carbon fibre (CF) process in batch and continuous conditions in chemical vapour deposition (CVD) under the application of a potential difference to the substrate during synthesis. The descriptions of embodiments are merely illustrative of the presented invention and deviations of the embodiments can be devised by those skilled in the art without departing from the scope of the invention. It therefore is intended that any such variations to be included within the scope of claims provided.

Example 1: Potential Applied Bias Synthesis of Carbon Nanotubes on Carbon Fibre in Batch Chemical Vapour Deposition (CVD) Synthesis In the following example, when a potential difference (bias) was applied to a carbon fibre substrate a significant increase in carbon nanotubes (CNTs) were synthesized and damage to the parent carbon fibre (CF) was reduced. Throughout the following example, carbon nanotube-grafted-carbon fibre is referred to as CNT-g-CF.

CF substrate, (AS4C-GP-12K-8, HS-CP-4000, continuous tow, polyacrylonitrile (PAN)-based, Hexcel Composites, UK) were impregnated with catalytic material by submerging for 2 min in a 5 wt % bi-catalyst material comprising ron(III) nitrate (≥98% ACS reagent, Sigma-Aldrich, UK)

and nickel(II) acetylacetonate (≥98%, VWR, UK) in ethanol solution (EtOH>99.7% BDH Prolabo, VWR, UK) in 1:1 stoichiometry, dip washed in deionised water (18 MΩ) for 1 min, then dried at standard ambient atmospheric temperature and pressure. All chemicals were used as-received, CFs were not treated (virgin) prior to catalyst precursor deposition.

Once dried, the CF were placed inside the apparatus as shown in FIG. 1. Thermal CVD CNT-g-CF synthesis was carried out on 10 cm length of CF tow which has been pre-deposited with catalyst precursor in a hot-walled CVD set-up using a 2" quartz tubular furnace (PTF 15/610, Lenton, UK). Quartz frames (Robson Scientific, UK) were used to hold the fibres in position in the reaction chamber (a furnace tube) maintaining accessibility to gas flow. Graphite foil (GF), 99.8%, (C1179, Advent Research Materials Ltd, UK) was chosen as the counter electrode in the circuit as it is a conductive and flexible material which does not catalyse the growth of CNTs. A sheet of compacted GF (approx. 100×180×0.2 mm) used as-received, was rolled into a cylinder and inserted into the 2" quartz tube, where it was allowed to unroll to create a 2" ID tubular counter electrode. Electrical connection to the counter electrode was made by piercing the GF with stainless steel (SS) wire. The electrical connection to CF was made by wrapping a piece of GF to the quartz frame then sandwiching the CFs with SS wire binding.

The wires inside the reaction chamber were kept apart by ceramic beads threaded over the wires to avoid shorting during the CNT-synthesis (white ceramic fish spine beads 1.5 mm bore, RS Components Ltd, Northants, UK). Quartz frames serve only to hold specimens in place during synthesis, and a shielding piece of quartz prevented shorting between the electrodes. The circuit arrangement is as shown in FIG. 2. Potential differences were measured using a high voltage probe (Testec High Voltage Probe TT-HVP 40, 1000:1 divider, division ratio accuracy 1%) connected to a voltmeter (ISO-Tech IDM67, ±0.7% voltage, IEC 1010-1 CAT II 600V). A 1:250 voltage amplifier (MM3P1.5/12, 1.5 W, 12 V input, linear high voltage output 3 kV max and 0.5 mA max, efficiency 55% to 70%, Spellman High Voltage Electronics, UK) was used to increase the voltage output in conjunction with a variable current and voltage power supply source (Mastech HY3003D, variable D.C. supply, 30 V max and 3 A max output, Digimess Instruments Ltd, UK). The connection to a power supply to provide a potential difference was made through shielded wires and a bespoke electrical feed through (LewVac Components Limited, UK) and reaction carried out within a 2" quartz tube.

Samples were subjected to inert gas (argon) for purging the systems prior to heating and then subjected to reducing atmosphere (argon with 10 volume percentage hydrogen) and to carbon feedstock (acetylene) once reaction temperature was obtained, as described in Table 1. The experimental procedure, including all relevant gas flows and typical furnace temperatures as measured by an external thermal probe, is set out in Table 1. For comparison, control samples were used to establish relative differences between samples which had CNTs not grown under an applied potential difference, in which the same CNT synthesis temperatures, gases and procedures were carried out (Table 1) but not attached to an electrical circuit.

Potential difference was applied/discharged to the CF substrate under inert gas conditions only. The charge imparted on the CF substrate was +300 V in relation to the counter electrode, with the counter electrode graphite foil earthed (electric-field determined to be on the order of 0.05 $V\mu m^{-1}$). The opposite configuration was tested, CF substrate earthed and GF+300 V, with identical CNT morphology observed on CF.

TABLE 1

| Time | Duration [min] | Gas with flow rate [standard cubic centimetres] | | | Measured temperature [° C.] | Potential difference applied | |
| | | Ar | Ar + H₂ (10 vol % H₂) | C₂H₂ | | Voltage [V] ‡ | Current [A] |
| --- | --- | --- | --- | --- | --- | --- | --- |
| Furnace connections are sealed and checked for leaks. Electric circuit constructed and checked. System is purged with inert gas prior to heating of furnace | | | | | | | |
| 10:00-10:20 | 20 | 500 | — | — | 18° C. @ 10:00 | — | — |
| 10:20-10:40 | 20 | 1000 | — | — | 18° C. @ 10:20 | — | — |
| Furnace switched on at heating rate 10° C. min⁻¹ to 770° C. under inert gas flow | | | | | | | |
| 10:40-12:00 | 80 | 500 | — | — | 18° C. @ 10:40 | — | — |
| Once at 770° C. switched on power supply and applied potential difference | | | | | | | |
| 12:00-12:10 | 10 | 2000 | — | — | 777° C. @ 12:00 | 300 | 0.01 |
| Introduction of reductive gas for 10 min prior to carbon feed-stock | | | | | | | |
| 12:10-12:20 | 10 | — | 2000 | — | 772° C. @ 12:10 | 300 | 0.01 |
| 12:20-13:20 | 60 | — | 2000 | 10 | 769° C. @ 12:20 | 300 | 0.01 |
| Once reaction is complete, furnace is switched off and left to cool with inert gas flow | | | | | | | |
| 13:20-13:30 | 10 | 500 | — | — | ~680° C. @ 13:20 | 300 | 0.01 |
| Potential difference switched off, any static discharged, continue to cool with inert gas flow | | | | | | | |
| 13:30-~18:30 | ~230 | — | — | — | ~600° C. @ 13:30 | 0 | 0 |

TABLE 1-continued

| Time | Duration [min] | Gas with flow rate [standard cubic centimetres] | | | Measured temperature [° C.] | Potential difference applied | |
|---|---|---|---|---|---|---|---|
| | | Ar | Ar + H$_2$ (10 vol % H$_2$) | C$_2$H$_2$ | | Voltage [V] ‡ | Current [A] |
| ~18:30-next day | — | — | — | — | ~100° C. @ 18:30 | — | — |

Figure 4:
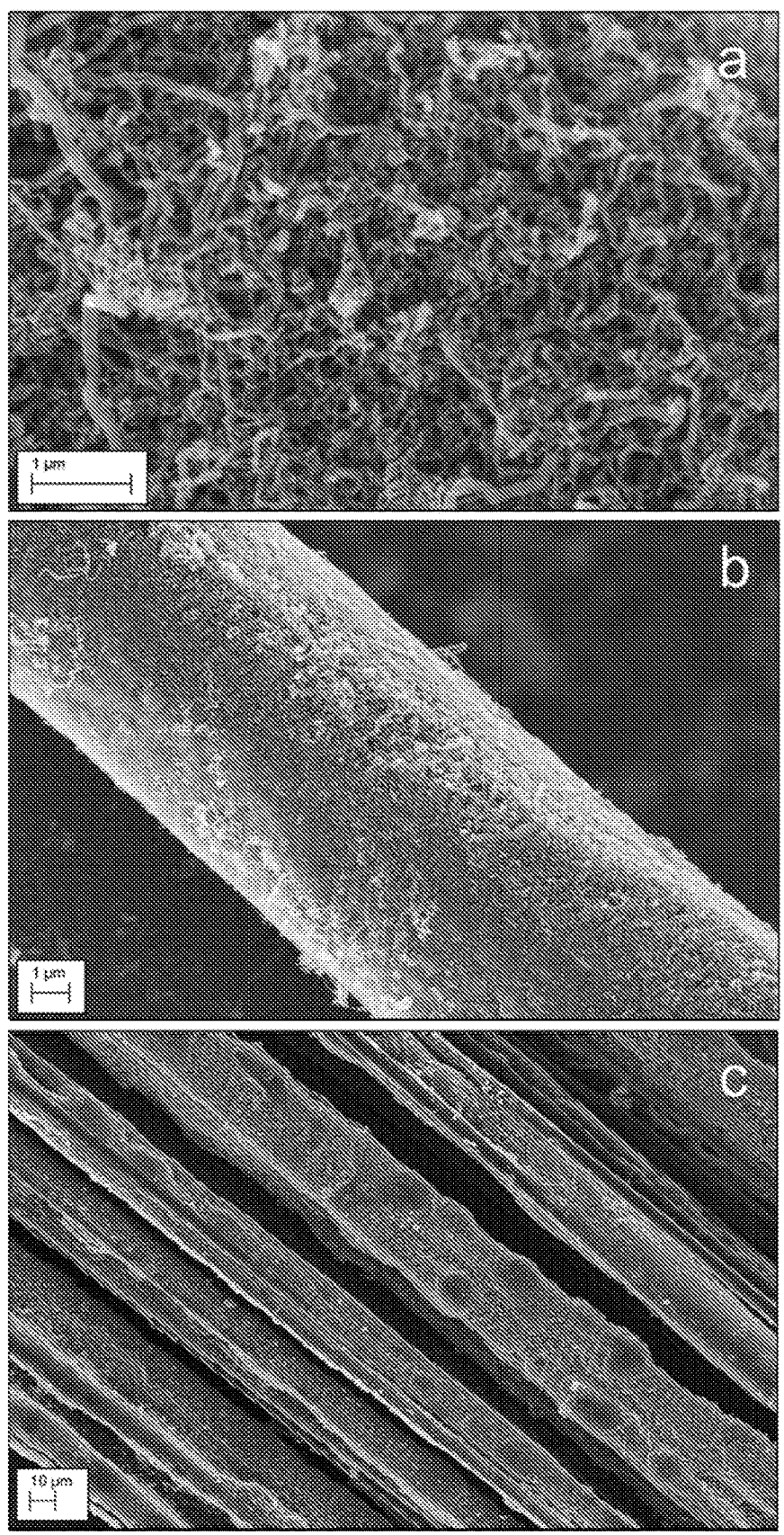
FIG. 4 shows a SEM image of CNT-g-CF synthesised under an applied potential difference of 300 V and bath sonicated for 5 min in ethanol (EtOH).

Furnace left sealed with inert gas (not flowing) until cooled down to room temperature.
Furnace is opened the following day to remove samples and for cleaning.
N.B. the circuit is switched on and off in inert atmosphere Samples were removed at room temperature and microscopy (FIGS. 3 and 4), Raman (FIG. 5), mechanical (FIG. 6) analysis undertaken. FIGS. 3 and 4 show SEM and TEM images of batch synthesised carbon nanotube grafted carbon fibre with no potential difference (batch CNT-g-CF (0V)) and batch synthesised carbon nanotube grafted carbon fibre which has had the application of a potential difference (batch CNT-g-CF (300V)), showing significant increase in CNTs grown from the CF surface in a dense forest like synthesis, and no observable damage associated with the growth of CNTs. The synthesis of CNT-g-CF with no applied potential difference (0V), FIG. 3.1 (a) to (c), shows severe pitting on the CF surface with sporadic CNT growth. CF subjected to a potential difference during CNT synthesis (300V), FIG. 3.1 (d) to (f), showed significant increase in the number of CNTs grown from the CF surface, showing a dense forest like synthesis. In areas where CNTs had been pulled away during SEM preparation of CNT-g-CF (300V) there was no observable damage associated with the growth of CNTs on the CF surface (FIG. 3.2). TEM images (FIG. 3.1 (g) & (h)) of the synthesised CNT-g-CF showed nanotube formations had grown from the surface of the CF in a random orientation. The CNTs synthesised under application of a potential difference had an average 56 nm diameter (standard deviation 35.7, range 8 to 155 nm), and where isolated CNT-g-CF are observed diameters of the fibre averaged 26 μm (standard deviation 7.8, range 14 to 47 μm), indicating a (average) perpendicular CNT growth length of approx. 10 μm. CNT perpendicular thickness is calculated assuming that bi-catalyst precursor deposited CF diameter after CNT synthesis is unchanged (6.9 μm, standard deviation 0.2, range 6.4 to 7.1 μm, N.B. Hexcel data sheet for as-received AS4C fibre diameter 6.9 μm.

The diameter of the fibres as received and after bi-catalyst deposition were measured and both were 6.9 μm in diameter as per the product data sheet.

Raman analysis of CNT-g-CF provides a non-destructive method of probing global sample properties. The $I_G$ to $I_D$ ration is often provided to establish the damage, and infer the structure of the CNTs on the CF. CF substrate provides an inherent coinciding addition to the measured Raman intensity, and care must be taken to establish if damage to the underlying substrate or the synthesised CNTs are adequately represented. Raman spectroscopy was carried out on LabRAM Infinity with 532 nm [2.33 eV] Nd-YAG green laser (LabSpec V4.18-06, 2005 software interface, Horiba Jobin Yvon Ltd., UK) in a backscattered geometry. Subtle mode sharpening of the D and G bands can be used to evaluate the presence of CNTs.

Figure 5:
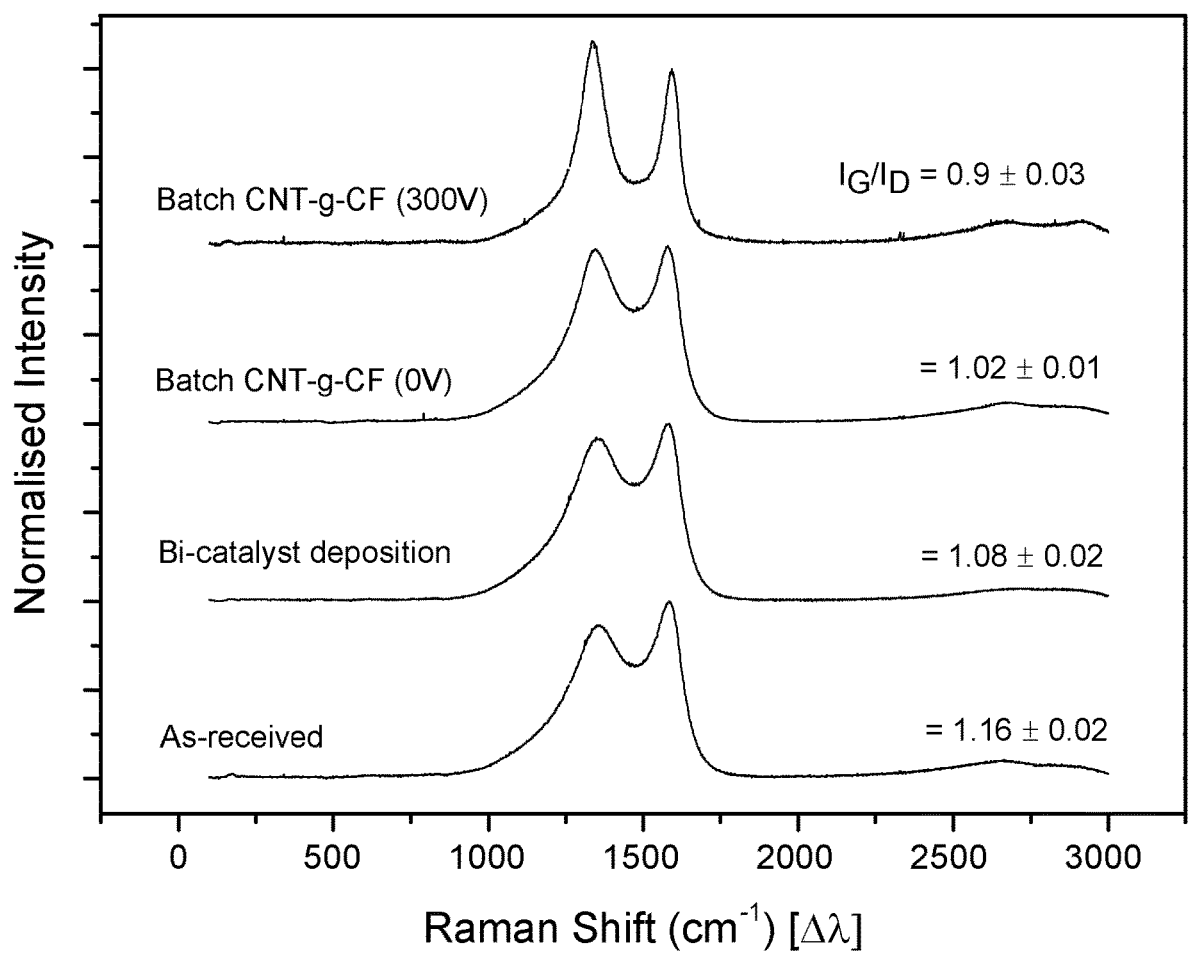
FIG. 5 shows Raman spectra comparing batch synthesized CNT-g-CF with and without potential difference applied to the substrate, with inserts of intensity of G mode to intensity of D mode ($I_G$ to $I_D$) ratio.

FIG. 5 shows Raman spectra of various fibres with inserts of $I_G$ to $I_D$ ratio. Spectra shown are an average of 5, taken over all sample areas with the exception of batch CNT-g-CF (0V) samples, which only areas of CNT growth were selected due to high variation and low CNT coverage on the surface. Batch CNT-g-CF (300V) refers to CNTs grafted onto the fibre surface with the application of a potential difference during CNT-synthesis. Batch CNT-g-CF (0V) is a typical CNT-g-CF synthesised sample carried out without the application of a potential difference in identical CVD conditions (N.B. 60 min CNT-synthesis duration). Batch CNT-g-CF (300V) shows distinct D and G mode sharpening attributed to the CNTs grown on the surface of the graphitic CF, when compared to the as-received CF and bi-catalyst precursor deposited CF spectra. A lowering of the $I_D/I_G$ ratio for CNT-g-CF (300 V) suggests that the CNTs grown are relatively defective, as observed in TEM analysis (FIG. 3.1 (h)), and typical of CVD MWNTs. The increased intensity in the D band for CNT-g-CF (300 V) was attributed to the addition of CNTs and not to any damage potentially sustained to the underlying parent structure (CF). This conclusion was rationalised because CNT-g-CF retained as-received CF tensile strength, observed in mechanical analysis and considering tensile strength is sensitive to surface defects. No mode sharpening of the D and G was observed in batch CNT-g-CF (0V) indicating that the relative density of CNTs on the surface is limited. The reduction in $I_D/I_G$ observed for the CNT-g-CF (0 V) is associated with pitting of the catalyst particles into the CF and sparsely synthesised CNTs, both clearly evident from microscopy analysis (FIG. 3.1 (a)), which directly correlate to the reduced single fibre mechanical properties observed.

Figure 6:
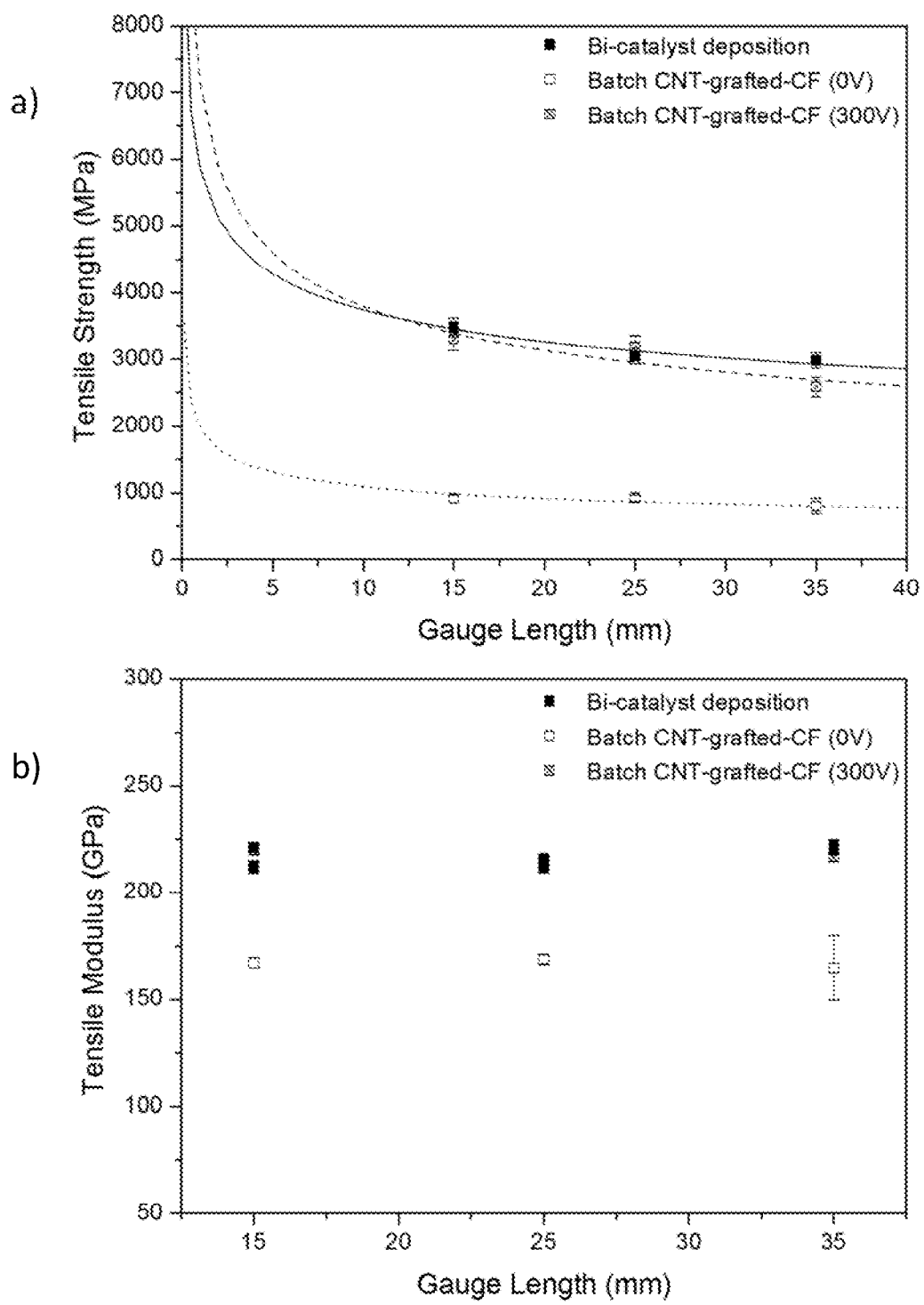
FIG. 6 shows single fibre tensile test data, namely tensile strength and tensile modulus, comparing batch synthesized CNT-g-CF with and without potential difference applied to the substrate.

Tensile strength (with generated tensile strength values using the Weibull shape and scalar parameters for gauge dependence) and tensile modulus of elasticity (Tensile Modulus) were measured for batch CNT-g-CF (300V), batch CNT-g-CF (0V) and bi-catalyst deposited CF, prior to CVD. Measurements were taken according to BS ISO 11566 standard (British Standards Institution, Carbon fibre—Determination of the Tensile Properties of Single-Filament Specimens. ISO 11566, (1996)), Method B, K value 16.6 mm/N, Epoxy adhesive 50/50 hardener to resin (Araldite Rapid Adhesive, Bostik Findley Ltd., Leicester, UK), cross sectional area value taken from data sheet (Hexcel Composites, HexTow™ AS4 Carbon Fiber, Data Sheet, 2009), 15 μm crosshead speed, standard ambient temperature and pressure (SATP). Results of this mechanical analysis are shown in FIG. 6. These results demonstrate that the batch CNT-g-CF (0V) has damage to the underlying CF support, showing a reduction in overall tensile properties associated with damage to the surface. The modulus of batch CNT-g-CF (0V) is reduced which also indicates that damage has occurred to the core of the fibres. In the batch CNT-g-CF (300V) sample the tensile strength and modulus are closely matched to the bi-catalyst deposited samples indicating limited damage has occurred during the synthesis and retention of substrate properties. The retention of the fibre properties is significant for uses as reinforcement in composites and for basic handling of the hierarchical material. To illustrate the adhesion between the CF and CNTs is mechanically robust the synthesised CNT-g-CF were bath sonicated in EtOH as a qualitative experiment. A four cm section was cut from the CNT-g-CF (300V) tow, left to soak in high-performance liquid chromatography (HPLC) EtOH (5 ml) for 1 h then bath sonicated in a small vial for 1 h (temperature 30° C.), the resultant fibres are shown in FIG. 4. The CNTs surrounding CFs are shown to be bound to the fibre surface after agitation with the CNT forest collapsed and densified due to solvent drying. CNT adhesion clearly demonstrates that the bond between CF and CNTs is significantly strong, an advantage over silica and alumina fibres where the CNT-fibre bond is likely to be weak.

Determination of specific surface area was achieved through re-arrangement of the BET (Brunauer, Emmett and Teller) isotherm in accordance with BSI ISO 9277. Determination of specific surface area of solids by gas adsorption-BET method 2012:24 using Micromeritics TriStar Surface Area and Porosity Analyser and TriStar3000 6.07 software (Micromeritics UK Ltd., UK) with oxygen-free $N_2$ (99.998 vol %, BOC, UK). Prior to a measurement, samples were degassed in $N_2$ for at least 4 h at 80° C. Specific surface area analysis showed the characteristically low CF, 0.28 $m^2g^{-1}$ was not significantly increased by the deposition of the bi-catalyst precursor, but showed a marked increase with the grafting of CNTs to the surface through the application of a potential difference. The BET measurement requires a significantly large volume of low surface material to produce a measureable specific surface area as the CNT-g-CF (0V) was produced on a significantly small scale (on the order of 10 cm of fibre processed) the sample was not of significant quantity nor surface area to provide a reliable surface area value. In contrast the CNT-g-CF (300V) had a significant surface area contribution from the grafted CNTs. CF without CNT showed a Type I adsorption isotherm, the CNT-g-CF (300 V) showed a Type IV adsorption isotherm.

In summary, these results obtained indicate that CF substrate is damaged in batch CNT-grafted-CF (0V) CVD synthesis, however when a potential difference is applied during synthesis batch CNT-grafted-CF (300V) shows retention of tensile properties. Raman shows no mode sharpening on the samples without applied potential difference indicating a very low CNT coverage, but distinctive CNT sharpening in batch CNT-grafted-CF (300V) sample indicating high CNT presence and confirming the SEM analysis.

Electric Field Determination

The electric field (E-field) generated can be calculated by making a number of simplifications. Firstly, instead of treating the carbon fibres separately (a roving typically contains 12000 fibres in total) they are treated as a single large fibre (radius=r), held inside a larger radius cylinder (R where r<R), comparable to a cylindrical capacitor (coaxial) arrangement. E-field is assumed to be uniform and perpendicular from the surface of the rod, towards the outer cylinder and that both surfaces are closed, infinitely long and separated by a distance (r–R=z). The space between the electrodes is filled with Ar and the dielectric constant of Ar taken as equal to air=vacuum=1. If a small region of the rod and cylinder are taken, such that the arrangement is now reduced to a parallel plate configuration, then the problem is reduced to the well-known E-field between two simple parallel plates;

$$E\text{ field} = \frac{V}{z}$$

E-field=electric field (V $m^{-1}$), V=voltage (V), z=distance from plates (m)

The E-field value provided is that at the point with shortest distance between electrodes (relating to the highest E-field).

The effective E-field strength when a potential difference of 300 V is applied to the batch arrangement described above is 0.05 V$\mu m^{-1}$.

Example 2: Continuous Development of Potential Applied Bias Synthesis of Carbon Nanotubes on Carbon Fibre In the following example, under application of potential difference even carbon nanotube synthesis was observed on carbon substrates in all positions, with smaller diameter carbon nanotubes. Without a potential difference, limited carbon nanotube synthesis which is not uniform along fibre length was observed.

CF substrate, in this instance AS4C-GP 12K-8 (HS-CP-4000, Hexcel Composites, UK) deposited with catalysts (nickel(II) acetylacetonate and iron(III) nitrate nonahydrate in 50:50 ratio at 4 weight percentage in solution (ethanol, then washed in deionized water) suitable for the synthesis of CNTs, once dried were threaded inside the apparatus with a whole spooled tow acting as a substrate source, as shown in FIGS. 7 and 8. FIG. 7 shows a schematic of the continuous CVD set-up with concentric quartz tubes. Quartz outer tube (51.0±0.5 OD, 2.5±0.2 wall thickness) supports the concentric tubes, middle tube (25.0±0.2 OD, 1.5±0.2 wall thickness) and inner tube (19.0±0.3±0.5 OD, 1.5±0.2 wall thickness) in a cantilever arrangement through the custom designed quick connection. Quartz tubes sourced from Robson Scientific. The small dashes at the ends of the quick fit connections are gas inlet/out positions. Furnace is 1.2 m long with a 0.8 m stable temperature hot zone, with glassware (end to end) in total measuring up to 3 m. FIG. 8 shows a schematic of the various reaction zones determined by the quartz tube length (more clearly seen in FIG. 7) and pulling speed of 1.2 m/h of the fibre tow through the furnace. Fibre is pulled though the multi-zone reactor from left to right, initially heating fibres in inert atmosphere to reaction temperature (zone $C_{left}$), reduction of catalyst precursor then occurs at reaction temperature for 10 min (zone B), and CVD CNT-synthesis for 30 min (zone A), finally cooling in an inert atmosphere (zone $C_{right}$) and sample collection at room temperature.

Figure 9:
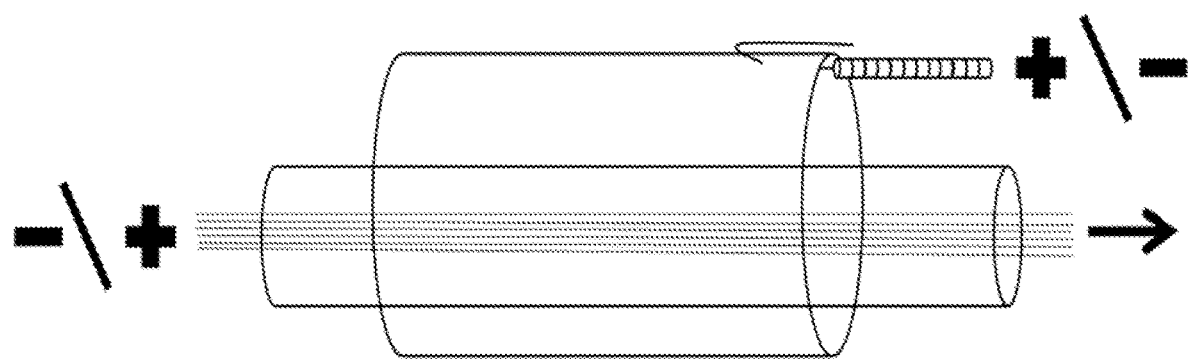
FIG. 9 shows a schematic of the electrode set-up used in the continuous CVD to syntheses continuous carbon nanotube-grafted-carbon fibre with an applied potential difference of 300 V to the substrate (cont. CNT-g-CF (300V)).

The continuous set-up was purged with nitrogen prior to switching on furnace and pre-deposited catalyst precursor loaded CF was held statically during heating to 770° C. at 10° C. $min^{-1}$, under nitrogen flow in the inert gas sleeves (flow rate 7500 standard cubic centimetres (sccm)). Once the furnace had achieved reaction temperature (770° C.) the initially heated fibre section was discarded and the pull-through rate was set to 1.2 $mh^{-1}$. CNT-synthesis gases were then added to the reaction chamber, with fibre exposed to the reduction zone ($N_2+H_2$ (2.4 volume percentage) at flow rate 3500 sccm) for 10 min, and CNT synthesis zone ($N_2+C_2H_2$ (1.3 volume percentage) at flow rate 325 sccm) for 30 min at the pull-through rate (1.2 $mh^{-1}$). The fibre was allowed to pass through the continuous set-up for 2 h. The system was then cooled down to 80° C. under nitrogen flow in the inert gas sleeves only (flow rate 7500 sccm) with the fibre held statically. Samples were taken periodically along the fibre tow for SEM and for Raman spectral analysis, only sample areas which had passed fully through the reactor were chosen to demonstrate a consistent and typical overview of the cont. CNT-g-CF, with samples spanning a distance of at least 2 m in total. The only difference between the continuous set-up without/with application of potential difference (cont. CNT-g-CF (0V) and cont. CNT-g-CF (300V), respectively), was the application of a potential difference of 300 V. FIG. 9 shows a schematic of the electrode set-up used in the continuous CVD to synthesize cont. CNT-g-CF (300V). Carbon fibre tow is shown being pulled through an insulating shielding quartz tube to separate the fibres from the counter electrode (graphite foil) which is connected by being pierced by a wire (wire shielded with ceramic beads to prevent shorting). The synthesis of CNTs occurs in the growth region of the shown in (zone A) whilst the counter electrode is situated in the inert atmosphere (zone $C_{right}$), and the connection made to the carbon fibres made before entry into the reactor (in this instance on the left). The connection to a power supply to provide a potential difference was made through rolling the CF over a stainless steel pin before entry to the reactor, with the counter electrode placed in-between the 2" quartz tube and inner tube. The potential difference was only applied/discharged under inert conditions and was kept constant at 300 V (CF positively charged).

Figure 10:
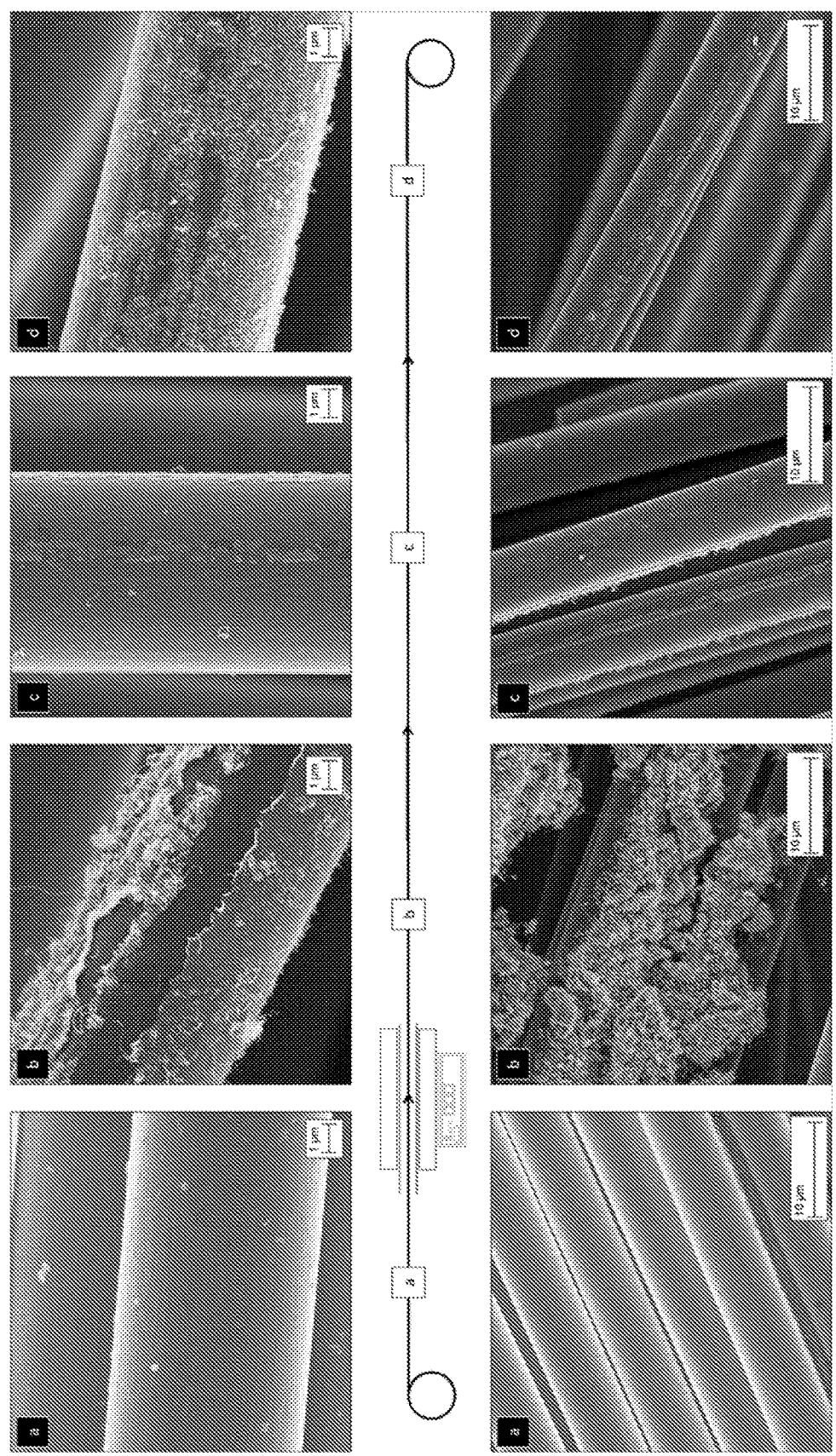
FIG. 10 shows SEM images of cont. CNT-g-CF (0V).

The SEM images of FIG. 10 show various areas of CNT-g-CF grown in the continuous set-up without application of potential difference (cont. CNT-g-CF (0V)). Letters indicate on the schematic the relative position of samples along fibre after it has fully passed through the reaction chamber ((a) is the pre-deposited catalyst precursor loaded CF which has not be subjected to CVD conditions and is included as a reference point only). All fibres have been deposited with iron nitrate and nickel(II) acetylacetonate bi-catalyst, sourced from a complete tow sample taken from a spool of over 25 m of fibre. There is poor uniformity of synthesised CNTs, in instances patchy CNT growth was noticed in localised areas (FIG. 10(b)) and along the fibre tow there were large bare regions void of CNTs (FIGS. 10(c) and (d)).

Figure 11:
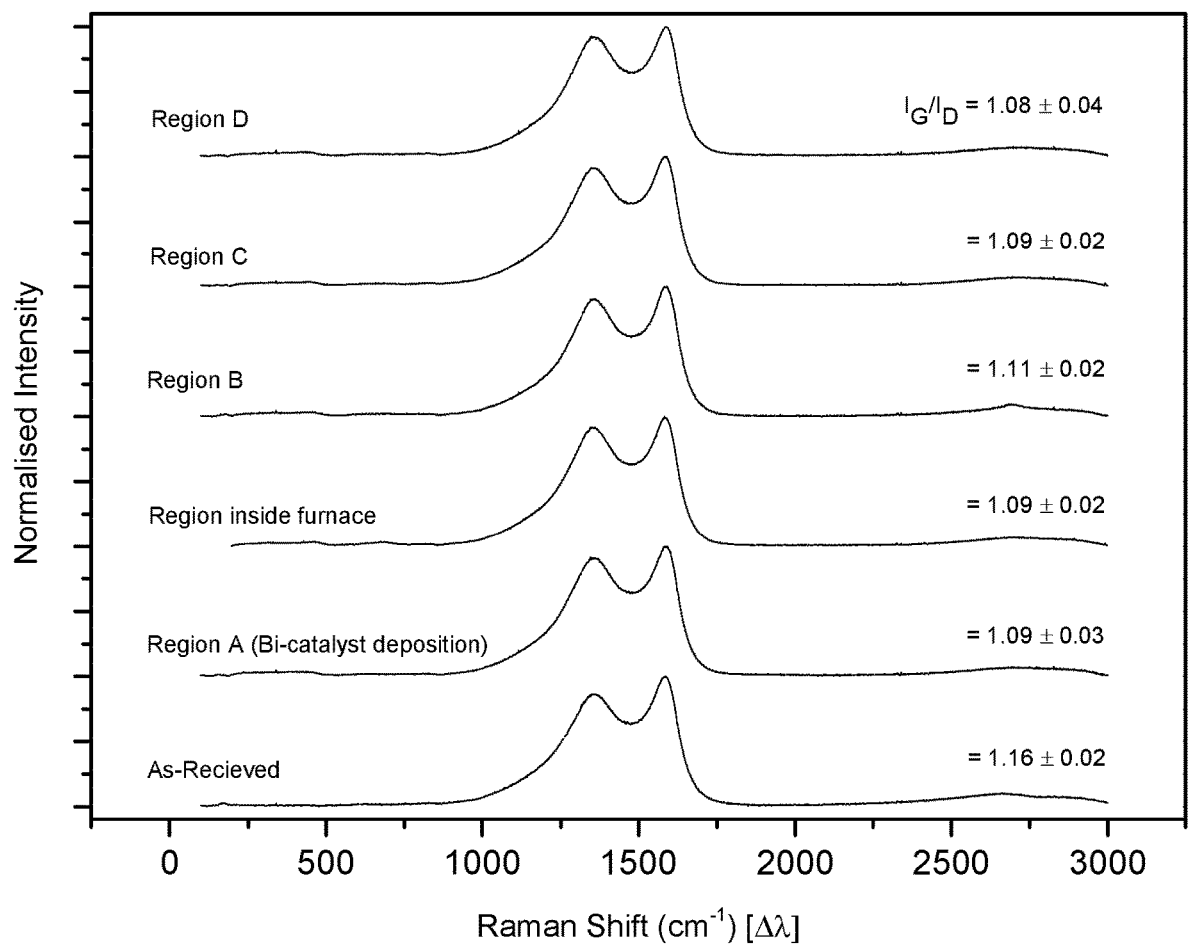
FIG. 11 shows Raman spectra of CNT-g-CF synthesised using the continuous CVD set-up without application of a potential difference, with inserts of $I_G$ to $I_D$ ratio.

Raman spectra of cont. CNT-g-CF (0V) showed no mode sharpening, normally an indication of CNTs over a graphitic substrate (CF signal). FIG. 11 shows Raman spectra of CNT-g-CF as received (prior to catalyst deposition) and synthesised using the continuous CVD set-up with inserts of $I_G$ to $I_D$ ratio. Spectra shown are an average of 5, taken over all sample areas, with regions A-D denoting the position relative to SEM images of FIG. 10. Region A is the Raman spectrum taken after the deposition of iron nitrate and nickel(II) acetylacetonate (not subjected to CVD conditions). Region inside furnace does not have a corresponding image in FIG. 10, but shows a similar CNT grafting to other samples shown, Regions B, C and D have passed fully through the CVD reactor, at a speed of 1.2 mh$^{-1}$.

Figure 12:
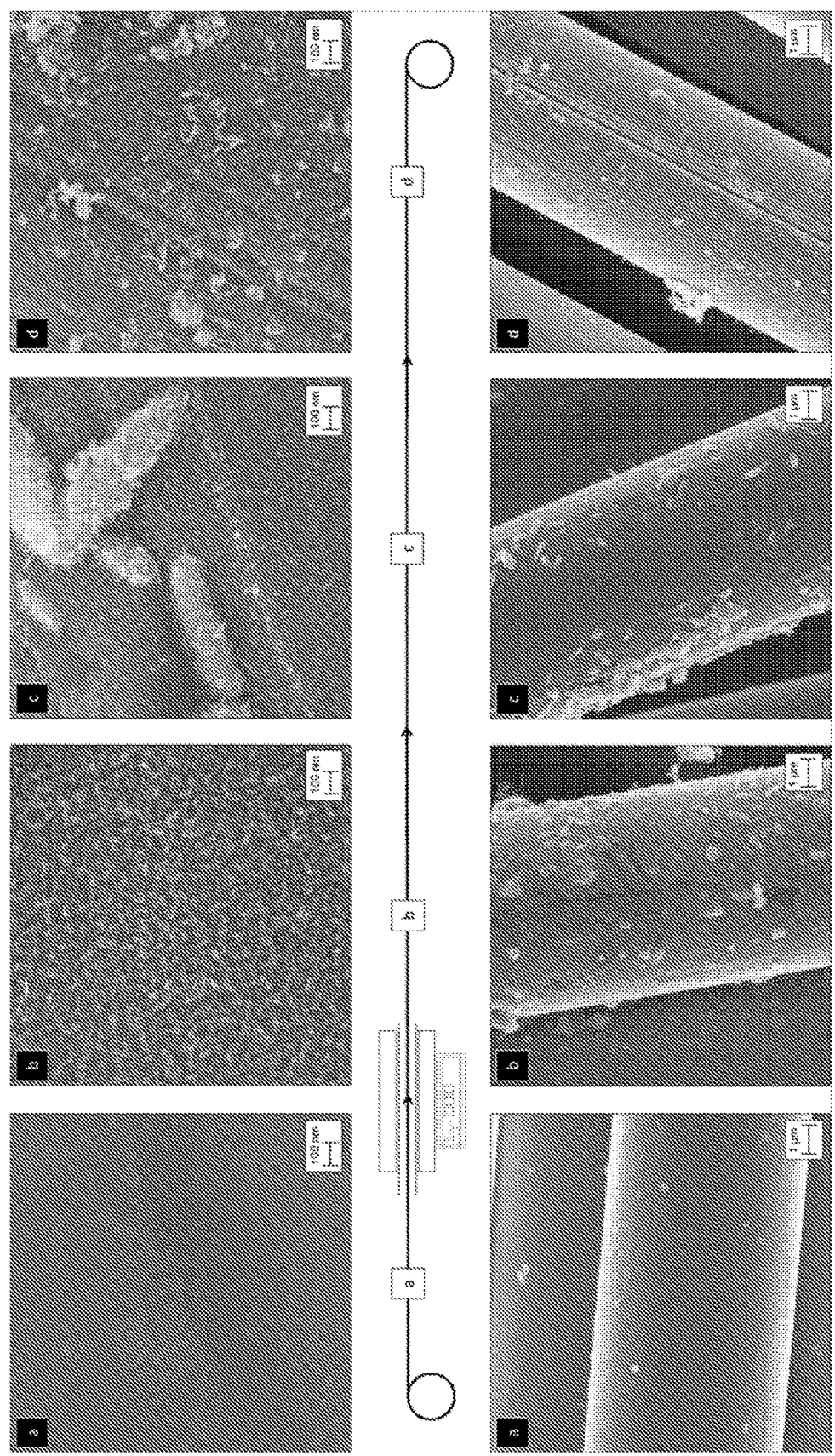
FIG. 12 shows SEM images of cont. CNT-g-CF (300V).

The SEM images of FIG. 12 show cont. CNT-g-CF grown using the continuous set-up with substrate under a potential difference of 300V (cont. CNT-g-CF (300V)). Letters indicate on the schematic the relative position of samples along fibre after it has fully passed through the reaction chamber ((a) is the pre-deposited catalyst precursor loaded CF which has not be subjected to CVD conditions and is included as a reference point only). All fibres have been deposited with iron nitrate and nickel(II) acetylacetonate bi-catalyst, sourced from a complete tow sample taken from a spool of over 25 m of fibre. All regions observed had an even growth of CNTs promoted though the application of a potential difference to the substrate (CF).

Figure 13:
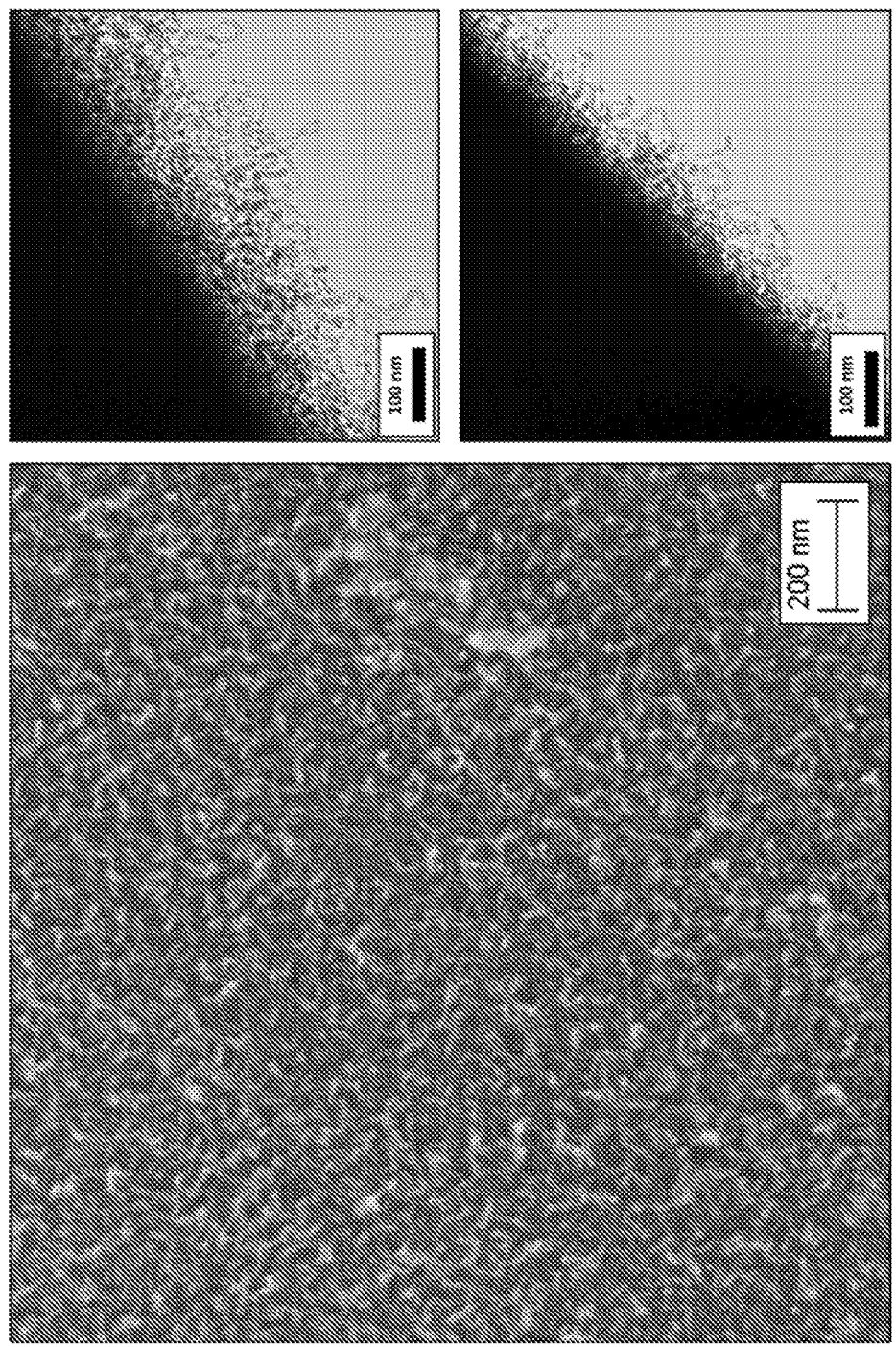
FIG. 13 shows an SEM enlarged area showing even CNT synthesis on CF surface (cont. CNT-g-CF (300V)). Smaller images adjacent are TEM images confirming few walled small diameter carbon nanotubes synthesised.

FIG. 13 shows an SEM enlarged area showing even CNT synthesis on CF surface (cont. CNT-g-CF (300V)). The CNT produced were of small diameter and demonstrated a dense network. Smaller images adjacent are TEM images confirming few walled small diameter carbon nanotubes synthesised. The CNTs synthesised under application of a potential difference in continuous CVD had an average 29 nm diameter (standard deviation 3.63, range 18 to 33 nm), isolated cont. CNT-g-CF (300 V) are observed to have fibre diameters averaged 7.0 µm (standard deviation 0.19, range 6.7 to 7.3 µm). TEM analysis of the cont. CNT-g-CF (300 V) surface with a CNT forest thickness is 125 nm (standard deviation 68.9, range 272 to 20 nm).

Figure 14:
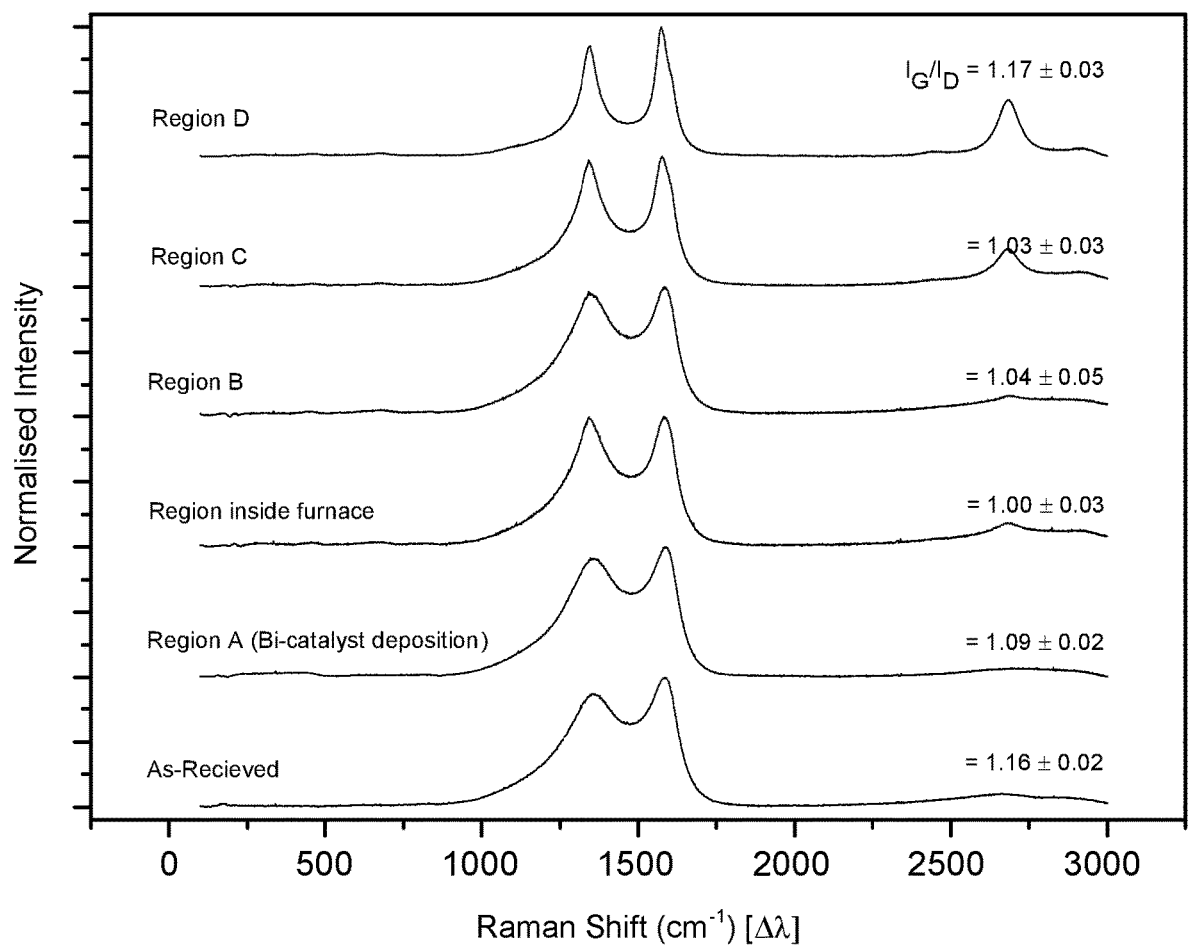
FIG. 14 shows Raman spectra of CNT-g-CF synthesised using the continuous CVD set-up with CF substrate under a potential difference (300V), inserts of $I_G$ to $I_D$ ratio included.

FIG. 14 shows Raman spectra of cont. CNT-g-CF (300V), with inserts of $I_G$ to $I_D$ ratio included. Spectra shown are an average of 5, taken over all sample areas, with regions denoting the position relative to SEM images of FIG. 12. Regions B, C and D have passed fully through the CVD reactor, at a speed of 1.2 mh$^{-1}$. CF substrate was applied with a potential difference of 300 V during CVD compared to the counter electrode (CF positively charged). Raman analysis of cont. CNT-g-CF (300V) with the observation of mode sharpening suggests that the fibre is significantly grafted with CNTs (Region C and Region D). In Regions C and D the inclusion of the G' mode is indicative of the addition of relatively crystalline CNTs to the CF surface.

Figure 15:
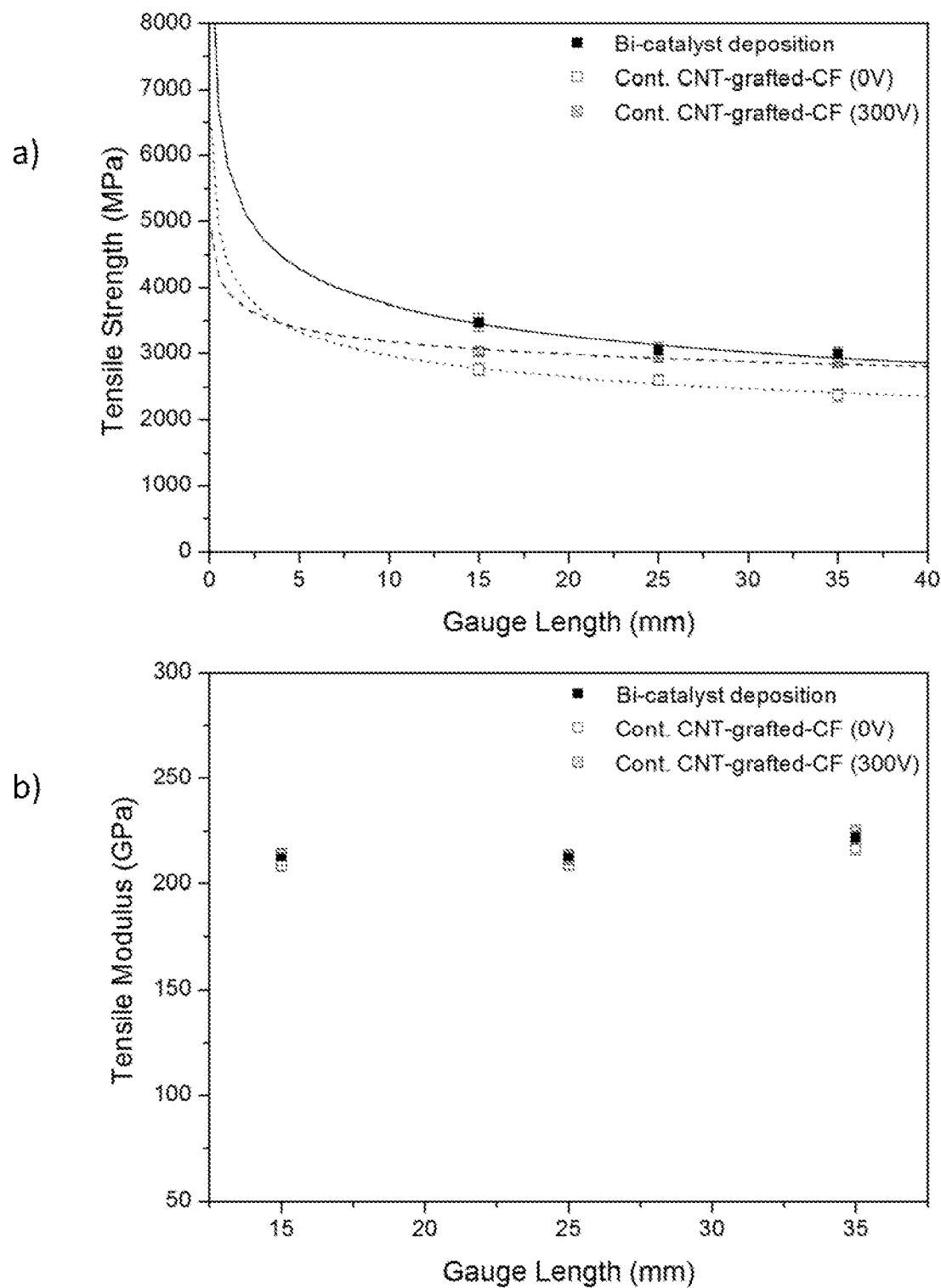
FIG. 15 shows single fibre tensile test data, namely tensile strength and tensile modulus, comparing cont. CNT-g-CF with and without potential difference applied to the substrate.

Tensile strength (with generated tensile strength values using the Weibull shape and scalar parameters for gauge dependence) and tensile modulus of elasticity (Tensile Modulus) were measured for cont. CNT-g-CF (300V), cont. CNT-g-CF (0V) and iron nitrate and nickel(II) acetylacetonate deposited CF, prior to CVD. Measurements were taken according to BS ISO 11566 standard, Method B, K value 16.6 mm/N, Epoxy adhesive 50/50 hardener to resin (Araldite Rapid Adhesive, Bostik Findley Ltd., Leicester, UK), CSA value taken from data sheet (Hexcel Composites, HexTow™ AS4 Carbon Fiber, Data Sheet, 2009), 15 µm crosshead speed, standard ambient temperature and pressure (SATP). The results of this analysis are shown in FIG. 15. These results demonstrate that the cont. CNT-g-CF (0V) has damaged the underlying CF support and shows a reduction in overall tensile strength associated with damage to the surface. Reduction in tensile strength in cont. CNT-g-CF (0V) is not as significant as in the batch CVD case (Batch CNT-g-CF (0V)), but there is diminished CNT coverage, as determined through SEM and Raman analysis. The modulus in cont. CNT-g-CF (0V) and cont. CNT-g-CF (300V) is similar which suggests that no significant damage has occurred to the core of the fibre in either case. In the cont. CNT-g-CF (300V) sample tensile strength closely matches the bi-catalyst deposited samples indicating limited damage has occurred during the synthesis with a low dependence on gauge length, but a significant promotion of CNTs grafted on the surface on the fibre was observed by SEM and Raman analysis.

The results obtained indicate that CNT synthesis without the application of potential difference shows hardly any CNT growth indicated by SEM and Raman (no disenable difference from the as-received and bi-catalyst) and a reduction of mechanical properties over as-received. CNT synthesis with application of potential difference showed even coverage of small diameter CNTs grown along all fibres which passed through the growth zone with improved mechanical properties over non biased (cont. CNT-g-CF (0V)) growth. For continuous CNT-grafted-CF (300V) inclusion of the G' mode is indicative of the addition of crystalline CNTs to the CF surface. Two metres of cont. CNT-g-CF (300V) on 12K AS4C tow was successfully synthesized as proof of principle.

Figure 16A:
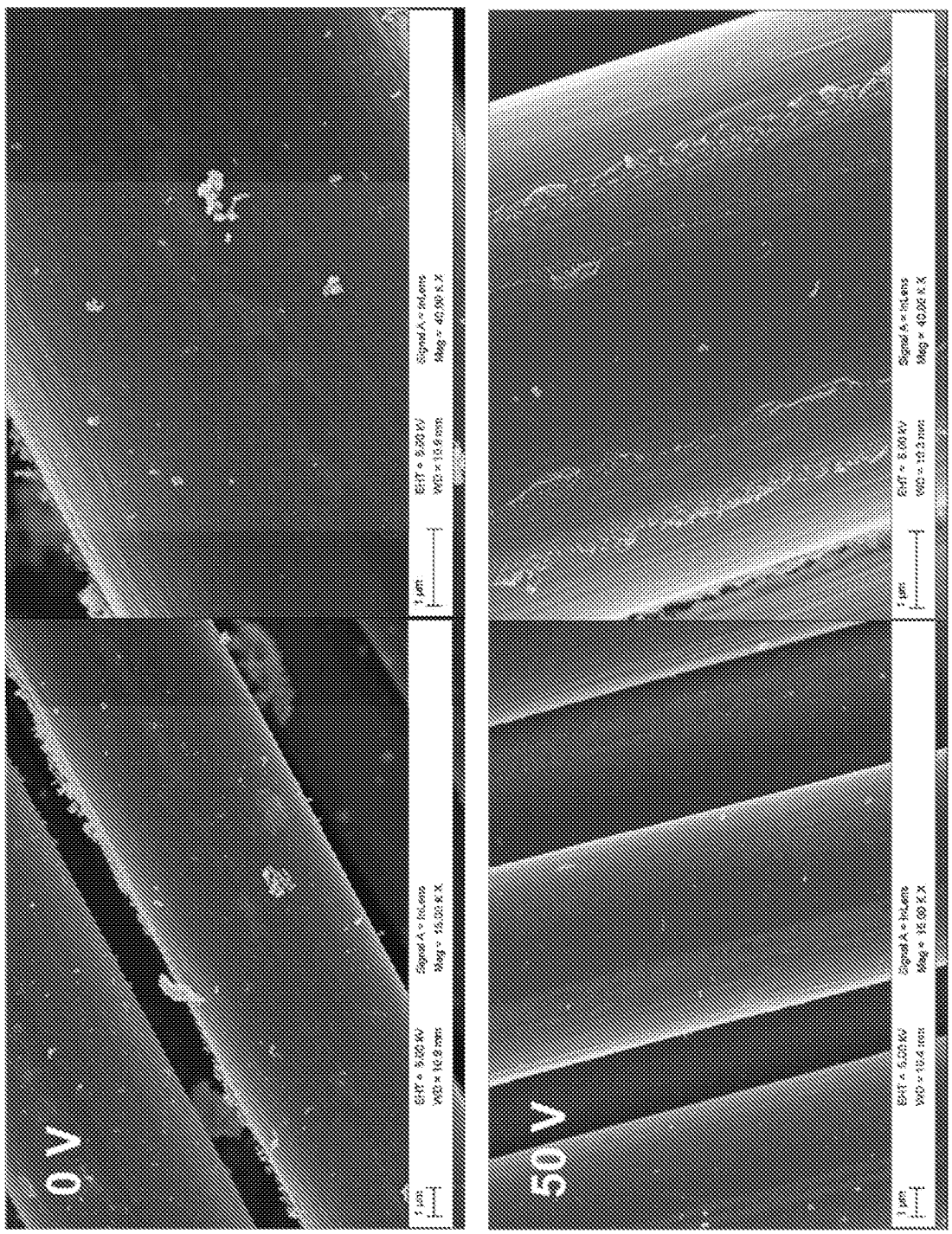
FIG. 16(a-c) shows SEM images of CNT-g-CFs produced by a process as described herein, with increasing potential difference applied to the carbon fibres.
Figure 16B:
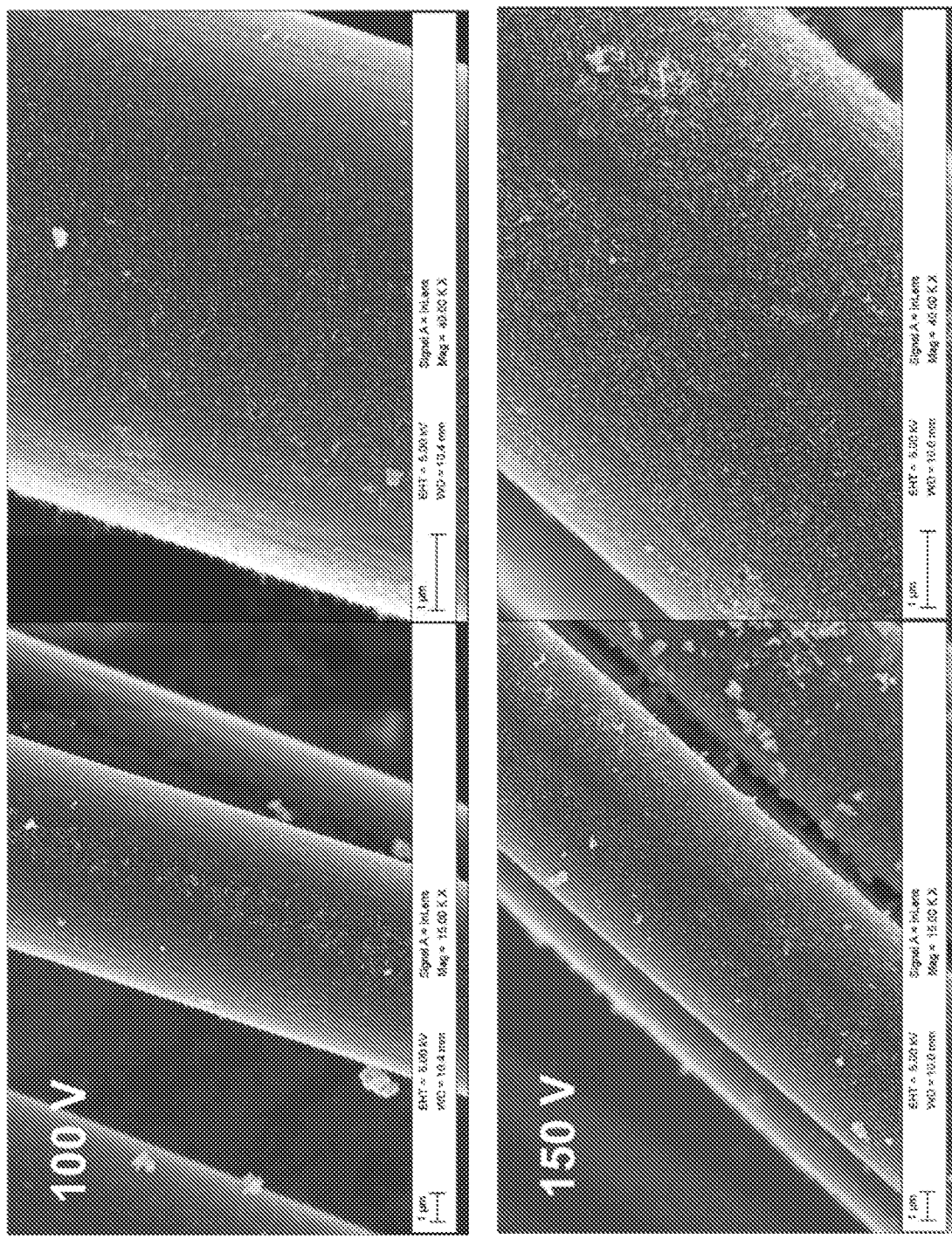
Figure 16C:
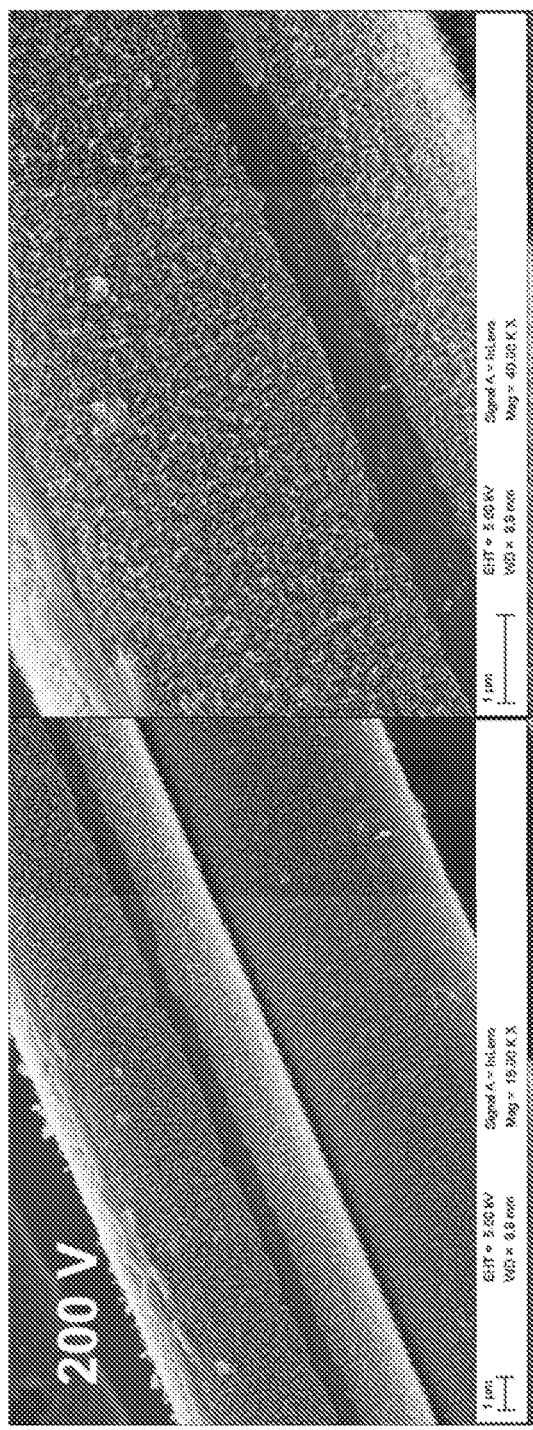

To reinforce findings, using the CVD continuous set-up and catalyst loaded carbon fibres described previously, the potential difference applied to the carbon fibre was increased during CVD synthesis of CNT-grafted-CF. The resultant CNT-g-CF (varying potential differences applied, FIGS. 16(a)-(c)) indicates that with an increasing potential difference between electrodes, CNT synthesis is promoted on fibre surfaces. The specified voltages (indicated in FIGS. 16(a)-(c)) relate to the system used and may be varied accordingly, without restriction of the general process as described here within.

Embodiments of the invention have been described by way of example only. It should be appreciated that variations of the described embodiments may be made without departing from the spirit and scope of the invention.

The invention claimed is:

1. A process for producing a carbon nanotube-grafted substrate, the process comprising:
   a. providing a conductive substrate having a catalytic material deposited on a surface thereof, the catalytic material being configured to catalyse growth of carbon nanotubes; and
   b. synthesizing carbon nanotubes on the substrate by a chemical vapour deposition process comprising exposing the substrate to a reductive gas and a carbon feedstock gas at the elevated temperature, in the presence of an inerting gas and at a temperature in the range of 400° C. to 1200° C. in a reaction chamber while spooling the substrate through the reaction chamber,
   characterised in that the process comprises using the substrate as an electrode and providing a counter electrode, applying a potential difference to the substrate in relation to the counter electrode and maintaining the potential difference of the substrate in relation to the counter electrode during the chemical vapour deposition process;
   wherein the substrate comprises a carbon fibre material or precursor thereof; and
   wherein the carbon nanotubes are grafted continuously along a spoolable length of the substrate,
   wherein the carbon nanotubes are grafted directly to a carbon fibre surface of the carbon fibre material or precursor thereof, and
   wherein the applied potential difference does not generate a plasma.

2. The process according to claim 1, wherein the carbon nanotubes are multi-walled carbon nanotubes.

3. The process according to claim 1, wherein the potential difference applied to the substrate in relation to the counter electrode is positive or negative and is between 0.1 volts and 30 000 volts.

4. The process according to claim 1, wherein the potential difference is kept constant during the chemical vapour deposition process.

5. The process according to claim 1, wherein heating to the temperature in the range of 400° C. to 1200° C. occurs prior to application of a potential difference to the substrate.

6. The process according to claim 1, wherein the reductive gas comprises hydrogen.

7. The process according to claim 1, wherein the carbon feedstock gas comprises carbon monoxide, a hydrocarbon or hydroxyl-substituted hydrocarbon, or a mixture of two of carbon monoxide, hydrocarbons or hydroxyl-substituted hydrocarbons, in gaseous form.

8. The process according to claim 1, wherein the chemical vapour deposition process is carried out at atmospheric pressure, or no further than 0.5 bar higher or lower than atmospheric pressure.

9. The process according to claim 1, wherein the catalytic material comprises iron (II) acetylacetone, iron (III) acetylacetone, nickel (II) acetylacetone, cobalt (II) acetylacetone, cobalt (III) acetylacetone, iron (III) nitrate, nickel (II) nitrate, cobalt (II) nitrate, or a mixture thereof.

10. The process according to claim 1, wherein the catalytic material comprises silicon oxide, silicon, silicon carbide, germanium, carbon, diamond, amorphous carbon aluminium oxide, zirconium oxide, carbon nanotubes or any other $sp^2$ carbon nanomaterial, or a mixture thereof.

11. The process according to claim 1, wherein the process additionally comprises the step of forming the substrate having catalytic material deposited thereon by depositing catalytic material on a substrate material.

12. The process according to claim 1, wherein:
   (a) the applied potential difference generates an electric field not exceeding 1 $V\mu m^{-1}$; and/or
   (b) the current density on the cross section of the substrate does not exceed 50 $Acm^{-2}$; and/or
   (c) the current density on the counter electrode surface area does not exceed $10 \times 10^{-4}$ $Acm^{-2}$; and/or
   (d) the power density does not exceed 1 $Wcm^{-3}$.

13. The process according to claim 1, wherein the process comprises one or more steps of further processing the CNT-grafted substrate subsequent to chemical vapour deposition.

14. The process according to claim 13, wherein the further processing comprises one or more of plasma treatment, surface roughening through chemical or oxidative processes, application of a barrier coating, sizing, heat treatment, chemical functionalization or resin impregnation.

15. The process according to claim 14, wherein heat treatment includes graphitisation and/or carbonisation.

16. The process according to claim 1, wherein the carbon nanotubes surround the substrate.

17. The process according to claim 1, wherein the carbon nanotubes are grafted directly on the catalytic material.

18. The process according to claim 1, wherein the catalytic material is a d-block transition metal-containing catalytic material or a non-metal seed catalyst, or a mixture thereof.

19. The process according to claim 1, wherein the chemical vapour deposition process is performed in a continuous fashion.

20. The process according to claim 1, wherein the carbon fibre material or precursor thereof is in the form of a multi-filament woven or nonwoven tow, roving or yarn, braid, ribbon or tape.

21. The process according to claim 1, wherein the carbon nanotubes have a length in the range of 5 nm to 20 microns.

22. A process for producing a carbon nanotube-grafted carbon fibre substrate, the process comprising:
   a. providing a conductive carbon fibre substrate having a metal-containing catalytic material deposited on a surface thereof, the catalytic material being configured to catalyse growth of carbon nanotubes; and
   b. synthesizing carbon nanotubes on the substrate by a chemical vapour deposition process in a reaction chamber, the chemical vapour deposition process comprising exposing the substrate to a reductive gas and a carbon feedstock gas at the elevated temperature, in the presence of an inerting gas and at a temperature in the range of 400° C. to 1200° C.;
   characterised in that the process comprises using the substrate as an electrode and providing a counter electrode, applying a potential difference to the carbon fibre substrate in relation to the counter electrode and maintaining the potential difference of the carbon fibre substrate in relation to the counter electrode during the chemical vapour deposition process;
- wherein the carbon nanotubes surround the carbon fibre substrate,
- wherein the carbon nanotubes are grafted directly to a surface of the carbon fibre substrate, and
- wherein the applied potential difference does not generate a plasma.

23. The process according to claim 22, wherein the chemical vapour deposition process is performed in a batchwise fashion.

24. The process according to claim 22, wherein the chemical vapour deposition process is performed in a continuous fashion.

25. The process according to claim 22, wherein the catalytic material is a d-block transition metal-containing catalytic material.

* * * * *